(12) United States Patent
McElwee-White et al.

(10) Patent No.: US 6,596,888 B2
(45) Date of Patent: Jul. 22, 2003

(54) MOCVD OF WN$_X$ THIN FILMS USING IMIDO PRECURSORS

(75) Inventors: Lisa McElwee-White, Gainesville, FL (US); Timothy J. Anderson, Gainesville, FL (US); Steven W. Johnston, San Jose, CA (US); Carlos G. Ortiz, Houston, TX (US); Omar J. Bchir, Gainesville, FL (US)

(73) Assignee: University of Florida, Gainesville, FL (US)

( * ) Notice: Subject to any disclaimer, the term of this patent is extended or adjusted under 35 U.S.C. 154(b) by 0 days.

(21) Appl. No.: 09/858,037

(22) Filed: May 15, 2001

(65) Prior Publication Data

US 2002/0045343 A1 Apr. 18, 2002

Related U.S. Application Data

(60) Provisional application No. 60/204,340, filed on May 15, 2000.

(51) Int. Cl.[7] .................... C07F 11/00; C23C 16/00
(52) U.S. Cl. .................. 556/59; 556/57; 546/2; 549/206; 427/255.394; 427/593; 106/1.05; 106/1.22; 106/1.25
(58) Field of Search ............... 546/2; 556/57, 556/59; 549/206; 427/593, 255.394; 106/1.05, 1.22, 1.25

(56) References Cited

PUBLICATIONS

Barnett et al., Organometallics, vol. 15, No. 1, pp. 424–428 (1996).*

J.E. Kelsey, et al. *J. Vac. Sci. Technol. B*, 17(3), May/Jun. 1999 pp. 1101–1104.

A.J. Nielson, Metal–Nitrogen Multiple Bonding in Transition Metal Complexes, *Chemistry in New Zealand*, Dec. 1988, pp. 131–135.

M.H. Tsai, et al. Metalorganic Chemical Vapor Deposition of Tungsten Nitride for Advanced Metallization, *Appl. Phys. Lett.*, 68, Jan. 1996, pp. 1412–1414.

T. Levine, et al., CVD Copper Barriers, Proc. ULSI XIII, *Materials Research Society*, (1998), pp. 95–101.

S. Ingrey, et al., Artifacts observed during Auger Profiling of Ta, Ti, and W metals, Nitrides and Oxynitrides, *J. Vac. Sci. Technol.*, 20(4), Apr. 1982, pp. 968–970.

S.H. Chuang, Master of Science Thesis, Low Pressure Chemical Vapor Deposition of Tungsen Nitride Thin Films from Bisimidotungsten Complex, National Chiao Tung University, Hsinchu, Taiwan, Republic of China (1992) pp. iii–iv.

Hsin–Tien Chiu and Shiow–Hyey Chuang, Tungsten Nitride Thin Films Prepared by *MOCVD*, *J. Mater, Res.*, vol. 8, No. 6, Jun 1993, pp. 1353–1360.

He, et al. Oxidation of the Zwitterionic Tungsten Amide $(OC)_5$ WNPhNPhC(OMe)Ph with $Br_2$ and $PCL_5$. Formation of $[(PhN)W(CO)_2X_2]_2$ and $(PhN)W(CO)_2X_2L$ (X=Br or Cl; L=MeCN, $Me_3C_6H_2NH_2$ and $i$–$BuNH_2$), J. Chem. Soc., Dalton Trans., 1998, pp. 3373–3378.

* cited by examiner

*Primary Examiner*—Porfirio Nazario-Gonzalez
(74) *Attorney, Agent, or Firm*—Akerman Senterfitt

(57) ABSTRACT

Single imido tungsten imido precursors are described for the deposition of tungsten nitride on a substrate by processes such as metal organic chemical vapor deposition. The precursors may be employed to form diffusion barrier layers on microelectronic devices. A method for forming tungsten nitride layers includes the steps of providing a tungsten imido species having the formula $L_yW(NR)X_n$, where R is a carbon containing group, y is an integer between 0 and 5, n is an integer between 0 and 4 and $L_y$ and $X_n$ are selected from the group of non-imido ligands. The single imido tungsten imido species is flowed to a surface of a substrate where the single imido tungsten imido species decomposes to form a tungsten nitride layer.

12 Claims, 11 Drawing Sheets

US 6,596,888 B2

MOCVD OF WN$_x$ THIN FILMS USING IMIDO PRECURSORS

CROSS REFERENCE TO RELATED APPLICATIONS

This application claims the benefit of U.S. Provisional Application No. 60/204,340 entitled "MOCVD of WN$_x$ THIN FILMS USING IMIDO PRECURSORS" filed May 15, 2000, the entirety of which is incorporated herein by reference.

STATEMENT AS TO FEDERALLY SPONSORED RESEARCH

This invention was made with United States Government support awarded by the Office of Naval Research, Grant/Contract No. N00014-99-1-0841. The United States Government has certain rights in this invention.

FIELD OF THE INVENTION

The invention relates generally to the field of semiconductors. More particularly, the invention relates to the use of single-source tungsten imido precursors in the formation of WN$_x$ based films on a substrate, and includes certain tungsten imido complexes and compounds (hereafter "TIC") as precursors.

BACKGROUND OF THE INVENTION

In the manufacture of integrated circuits, barrier layers are often needed to prevent the diffusion of one material to an adjacent material. For instance, when aluminum contacts silicon surfaces, spiking can occur, and when aluminum comes into direct contact with tungsten, a highly resistive alloy can be formed.

Copper is of great interest for use in metallization of VLSI microelectronic devices and has begun replacing aluminum due to copper's lower resistivity, higher resistance to electromigration, low contact resistance to most materials, and ability to enhance device performance via reduction of RC time delays thereby producing faster microelectronic devices. Moreover, copper may allow a reduced number of metal levels to be necessary because it can generally be packed more tightly than aluminum.

Copper CVD processes which are suitable for large-scale manufacturing and the conformal filling of high aspect ratio inter-level vias in high density integrated circuits are regarded by many as extremely valuable to the electronics and optoelectronics industry, and are therefore being investigated in the art. Unfortunately Cu, like Al, is quite mobile in silicon. Upon direct contact with Si, Cu diffuses and reacts rapidly to form compounds such as Cu$_3$Si. Formation of compounds such as Cu$_3$Si can destroy shallow junctions and contacts during subsequent thermal annealing steps and can result in degraded device performance, or even device failure.

When copper is used as a conductive layer in a device having multi-layer metallization, long-term reliability can only occur if there is little to no interdiffusion between the copper and layers surrounding the copper layer. Copper interdiffusion can result in an increase in contact resistance, change the barrier height, result in leaky PN junctions, cause embrittlement of the contact layer, and destroy electrical connections to the chip. With the increased use of copper as an interconnect material to form high speed integrated circuits, an effective barrier against copper diffusion is required. Diffusion barriers are layers interposed between a material to be isolated (e.g. Cu) and the underlying circuit, and are commonly used in an attempt to prevent undesirable reactions involving the material to be isolated with one or more layers of the underlying circuit.

Research has indicated that nitride barriers are better candidates for reliable diffusion barriers from the interdiffusion standpoint and provide lower electrical resistivities than their pure metal counterparts. Titanium nitride (TiN) has been used as a diffusion barrier for aluminum, but its performance suffers when copper metallization is employed due to excessive copper interdiffusion therethrough. Tantalum nitride (TaN) has generally been the barrier material of choice to date for copper metallization. However, tantalum nitride requires a two-step chemical mechanical polishing (CMP) procedure that results in nearly a one order of magnitude increase in dishing of the copper surface and often results in scratching of the inter-layer dielectric (ILD). Dishing of the copper is caused by a substantially higher CMP etch rate of copper compared to TaN.

Unlike TaN, tungsten nitride (WN$_x$) may be etched using a single CMP process and results in reduced copper dishing relative to copper dishing using TaN as a barrier material because the CMP etch rates of copper and WN$_x$ are essentially equal. Tungsten nitride is also known to be an effective diffusion barrier against copper penetration at temperatures of up to approximately 750° C. As used herein, WN$_x$ is understood to include the numerous tungsten nitride stoichiometries, such as WN, WN$_2$, and W$_2$N. However, there are many other WN$_x$ stoichiometries. It is known that WN has a hexagonal crystal structure, WN$_2$ is rhombohedral, and W$_2$N has a face centered cubic structure. Each of the three stoichiometries listed above are thermodynamically stable, but W$_2$N has the lowest resistivity of the three (50 $\mu\Omega$-cm bulk resistivity).

One application for tungsten nitride films is the formation of diffusion barriers between the tungsten of tungsten plugs and adjoining metallization layers on the surface of the wafer, such as copper. Such a diffusion barrier is shown in FIG. 1.

FIG. 1 shows a tungsten plug 14 extending down to a silicon substrate 10 with an overlying copper layer 16 and an intervening diffusion barrier 12. The tungsten plug structure is one example of an application where tungsten nitride has been found as a suitable replacement for titanium nitride, as it is easily formed over the tungsten plug 14.

As feature sizes in integrated circuits have decreased to below 0.25 $\mu$m, the necessity for thermally stable, high conformity interface diffusion barriers and gate electrodes has become more important. Deposition of conformal and continuous barrier layers of tungsten nitride at relatively low temperatures on high-aspect-ratio structures is not possible with current processes. The two common methods for deposition of WN$_x$ include:

1) physical deposition techniques such as sputtering; and
2) chemical vapor deposition (CVD) from the reaction of tungsten halides and ammonia.

Each above method has associated difficulties. Conventional physical vapor deposition technology involves reactive sputtering from a tungsten target in an atmosphere of gaseous nitrogen with an argon carrier gas. Energized particle techniques, particularly sputtering, generally result in poor step coverage primarily due to shadowing. Applied to small features with high aspect ratios, poor step coverage of the barrier layer may result in areas of excessively thin or missing barrier material allowing copper diffusion into the underlying substrate. Moreover, sputter deposited layers are prone to generate high tensile stress to adjacent layers which may cause defects which may result in degraded device performance and yield loss in integrated circuits.

Current chemical vapor deposition processes for forming $WN_x$ generally involve the reduction of tungsten halides such as $WF_6$ and $WCl_6$ by $NH_3$. Although some success has been achieved with halide reduction schemes, at least three major obstacles exist for their use in future generations of integrated circuits. First, the high deposition temperatures (>700° C.) that are required to dissociate tungsten halide molecules are incompatible with most future low dielectric constant materials and some metallization layers. Second, the reaction byproducts (such as HF and HCl) are extremely corrosive and can rapidly etch other exposed device layers (such as Si and $SiO_2$) as well as decrease the operating lifetime of processing equipment. Finally, adduct formation, which can occur when using $WF_6$ and $NH_3$, must be avoided, especially as feature sizes shrink below 0.18 µm. Adduct formation commonly results from gas phase nucleation, as opposed to the desired chemical reaction occurring at the wafer surface.

It is apparent from the above discussion that a need exists for a new process for forming high quality tungsten nitride films which overcomes the problems existing with conventional chemical vapor deposition and physical vapor deposition processes, and which can be used to form a suitable barrier against copper diffusion. The process should be operable at a sufficiently low temperature to avoid copper penetration, limit or avoid generation of corrosive reaction by-products and deposit highly conformal layers capable of filling high aspect ratio structures (e.g. vias).

It would be preferable to utilize a single-source metal organic precursor molecule for the MOCVD (or other suitable deposition technique) of tungsten nitride thin films. The use of suitable metal organics would allow deposition at lower temperatures to ensure compatibility with future low dielectric constant and certain metallization films. The single-source nature of the precursors would allow a simplified reactor delivery system and avoid the possibility of adduct formation that has been reported when $WF_6$ and $NH_3$ are used to form $WN_x$.

Chiu et al. has reported the use of a single-source metalorganic precursor to deposit WN films. [Chiu H. T., S. H. Chuang, J. Mater. Res., 8(6), 1353, (1993]. The precursor used by Chiu was $(^tBuN)_2W(NH^tBu)_2$ (bis(tertbutylimido) bis(tertbutylamido)tungsten), which was delivered via a solid source delivery system. Chiu's precursor can be classified as a tungsten imido complex having two (2) imido ligands (=NR), the imido groups being covalently bonded to a metal (W). An imido group (=NR) can be defined as a nitrogen atom which is covalently multiply bonded to a metal (e.g. W), with the nitrogen atom also bonded to only one other group (e.g. H, alkyl, aryl, or silyl group). As used herein, the term alkyl includes cyclic alkyls.

An imido group may be contrasted with an amido group, which has the formula $NR_2$. In addition to the covalent bond with the metal, amido groups bear two (2) other substituents (e.g. H, alkyl, aryl, or silyl group). Thus, although Chiu discloses a tungsten imido complex, Chiu's tungsten imido complex has two (2) imido ligands, as opposed to tungsten imido complexes where tungsten has only a single imido ligand.

Chiu's depositions were thermal decomposition reactions over a temperature range of 450–650° C., but with very slow growth rates of 20–100 Å/min. The resulting films were mainly polycrystalline $W_2N$ with lattice parameters of 4.14–4.18 Å. The films had relatively high resistivities of 620–7000 µΩ-cm, with marginal step coverage (50–85%) for a 0.40 µm device feature.

The metal organic source reagent should be storage-stable, capable of easy transport to the reactor, possess appropriate decomposition characteristics, and substantially avoid gas phase nucleation. Such a process should preferably result in a highly conformal layer, the layer formed capable of conformal coverage in high aspect ratio features. Importantly, the layer formed should have very low resistivity to avoid impairing the speed of devices incorporating the layer. Deposition rates should also be high to permit efficient production and reduced costs. The increased demand for $WN_x$ reagents possessing these properties for use to form improved barriers in metallization schemes, such as copper, necessitates the exploration of novel metal-organic precursors and apparatus and methods for their use.

SUMMARY OF THE INVENTION

A source reagent composition for the formation of tungsten nitride films includes at least one single imido tungsten imido species selected from the group consisting of:
i) Tungsten imido complexes of the formula:

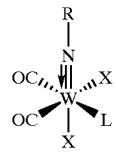

R is selected from the group consisting of H, Cl, $C_1$–$C_8$ alkyl, aryl, $C_1$–$C_8$ perfluoroalkyl, silicon-containing groups of the type $SiR_1R_2R_3$ and nitrogen-containing groups of the type $NR_4R_5$, where $R_1$–$R_5$ are selected from the group consisting of H, Cl, $C_1$–$C_8$ alkyl, aryl and $C_1$–$C_8$ perfluoroalkyl. X is selected from the group consisting of F, Cl, Br, I and $N_3$. L is selected from the group consisting of $C_1$–$C_8$ alkylnitrile, arylnitrile, ether, cyclic ether, heterocyclic aromatic amine, heterocyclic aliphatic amine and alkylamine ($NR_{11}R_{12}R_{13}$), where $R_{11}$, $R_{12}$, $R_{13}$ are selected from the group consisting of H, $C_1$–$C_8$ alkyl, aryl, $C_1$–$C_8$ perfluoroalkyl and silicon-containing groups of the type $SiR_{21}R_{22}R_{23}$, $R_{21}$, $R_{22}$ and $R_{23}$ being selected from the group consisting of H, $C_1$–$C_8$ alkyl, aryl and $C_1$–$C_8$ perfluoroalkyl.
ii) tungsten imido complexes of the formula:

$$X_yL_{5-y}W(NR) \text{ or } X_yL_{4-y}W(NR)$$

where R is selected from the group consisting of H, Cl, $C_1$–$C_8$ alkyl, aryl, $C_1$–$C_8$ perfluoroalkyl, silicon-containing groups of the type $SiR_1R_2R_3$ and nitrogen-containing groups of the type $NR_4R_5$. $R_1$–$R_5$ are selected from the group consisting of H, Cl, $C_1$–$C_8$ alkyl, aryl and $C_1$–$C_8$ perfluoroalkyl. X is selected from the group consisting of F, Cl, Br, I, $N_3$ and $NR_{11}R_{12}$, where $R_{11}$ and $R_{12}$ are selected from the group consisting of H, Cl, $C_1$–$C_8$ alkyl, aryl, $C_1$–$C_8$ perfluoroalkyl, silicon-containing groups of the type $SiR_{13}R_{14}R_{15}$ and nitrogen-containing groups of the type $NR_{16}R_{17}$, $R_{13}$–$R_{17}$ being selected from H, Cl, $C_1$–$C_8$ alkyl, aryl and $C_1$–$C_8$ perfluoroalkyl.
y is an integer between 2 and 4. L is selected from the group consisting of $C_1$–$C_8$ alkylnitrile, arylnitrile, ether, cyclic ether, heterocyclic aromatic amine, heterocyclic aliphatic amine, alkylamine ($NR_{21}R_{22}R_{23}$), where $R_{21}$, $R_{22}$, $R_{23}$ are selected from the group consisting of H, $C_1$–$C_8$ alkyl, aryl, $C_1$–$C_8$ perfluoroalkyl and silicon-containing groups of the type $SiR_{24}R_{25}R_{26}$, $R_{24}$, $R_{25}$ and $R_{26}$ being selected from the group consisting of H, $C_1$–$C_8$ alkyl, aryl and $C_1$–$C_8$ perfluoroalkyl.

iii) tungsten imido complexes of the formula:

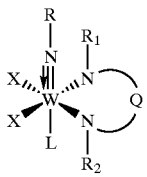

where R, $R_1$, $R_2$ are selected from the group consisting of H, Cl, $C_1$–$C_8$ alkyl, aryl, $C_1$–$C_8$ perfluoroalkyl, silicon-containing groups of the type $SiR_3R_4R_5$ and nitrogen-containing groups of the type $NR_6R_7$, $R_3$–$R_7$ being selected from the group consisting of H, Cl, $C_1$–$C_8$ alkyl, aryl and $C_1$–$C_8$ perfluoroalkyl.

X is selected from the group consisting of F, Cl, Br, I, $N_3$ and $NR_{11}R_{12}$, $R_{11}$ and $R_{12}$ are selected from the group consisting of H, Cl, $C_1$–$C_8$ alkyl, aryl, $C_1$–$C_8$ perfluoroalkyl, silicon-containing group of the type $SiR_{13}R_{14}R_{15}$ and nitrogen-containing groups of the type $NR_{16}R_{17}$, $R_{13}$–$R_{17}$ being selected from the group consisting of H, Cl, $C_1$–$C_8$ alkyl, aryl, $C_1$–$C_8$ perfluoroalkyl.

Q is selected from the group consisting of $(CH_2)_2$, $(CH_2)_3$, and CH=CH. L is selected from the group consisting of $C_1$–$C_8$ alkylnitrile, arylnitrile, ether, cyclic ether, heterocyclic aromatic amine, heterocyclic aliphatic amine and alkylamine ($NR_{21}R_{22}R_{23}$), where $R_{21}$, $R_{22}$, $R_{23}$ are selected from the group consisting of H, $C_1$–$C_8$ alkyl, aryl, $C_1$–$C_8$ perfluoroalkyl and silicon-containing group of the type $SiR_{24}R_{25}R_{26}$ $R_{24}$, $R_{25}$, $R_{26}$ are selected from the group consisting of H, $C_1$–$C_8$ alkyl, aryl and $C_1$–$C_8$ perfluoroalkyl. L may also be an empty coordination site with no ligand.

iv) tungsten imido complexes of the formula:

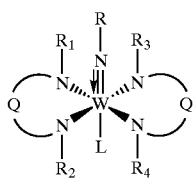

R, $R_1$–$R_4$ are selected from the group consisting of H, Cl, $C_1$–$C_8$ alkyl, aryl, $C_1$–$C_8$ perfluoroalkyl, silicon-containing groups of the type $SiR_5R_6R_7$ and nitrogen-containing groups of the type $NR_8R_9R_5$–$R_9$ being selected from the group consisting of H, Cl, $C_1$–$C_8$ alkyl, aryl, $C_1$–$C_8$ perfluoroalkyl.

Q is selected from the group consisting of $(CH_2)_2$, $(CH_2)_3$ and CH=CH. L is selected from the group consisting of $C_1$–$C_8$ alkylnitrile, arylnitrile, ether, cyclic ether, heterocyclic aromatic amine, heterocyclic aliphatic amine and alkylamine ($NR_{11}R_{12}R_{13}$), $R_{11}$, $R_{12}$, $R_{13}$ being selected from the group consisting of H, $C_1$–$C_8$ alkyl, aryl, $C_1$–$C_8$ perfluoroalkyl and silicon-containing groups of the type $SiR_{14}R_{15}R_{16}$ where $R_{14}$, $R_{15}$, $R_{16}$ are selected from the group consisting of H, $C_1$–$C_8$ alkyl, aryl and $C_1$–$C_8$ perfluoroalkyl. L may also be an empty coordination site with no ligand.

v) tungsten imido complexes of the formula:

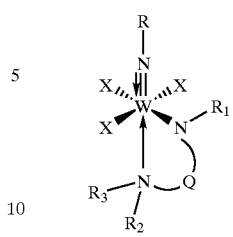

R, $R_1$–$R_3$ are selected from the group consisting of H, Cl, $C_1$–$C_8$ alkyl, aryl, $C_1$–$C_8$ perfluoroalkyl, silicon-containing groups of the type $SiR_5R_6R_7$ and nitrogen-containing groups of the type $NR_8R_9$, where $R_5$–$R_9$ are selected from the group consisting of H, Cl, $C_1$–$C_8$ alkyl, aryl and $C_1$–$C_8$ perfluoroalkyl.

X is selected from the group consisting of F, Cl, Br, I, $N_3$ and $NR_{11}R_{12}$, where $R_{11}$ and $R_{12}$ are selected from the group consisting of H, Cl, $C_1$–$C_8$ alkyl, aryl, $C_1$–$C_8$ perfluoroalkyl, silicon-containing groups of the type $SiR_{13}R_{14}R_{15}$ and nitrogen-containing groups of the type $NR_{16}R_{17}$, $R_{13}$–$R_{17}$ being selected from the group consisting of H, Cl, $C_1$–$C_8$ alkyl, aryl, $C_1$–$C_8$ perfluoroalkyl. Q is selected from the group consisting of $(CH_2)_2$ and $(CH_2)_3$.

In a preferred embodiment, the single imido tungsten imido species is at least one selected from the groups of formulas consisting of $X_yL_{5-y}W(NR)$ and $X_yL_{4-y}W(NR)$ as specified under (ii), tungsten imido complexes having the formula $X_yL_{5-y}W(NR)$ being more preferred. For the more preferred complexes, y is preferably =4.

L can be alkylnitrile. R can be selected from the group of $C_1$–$C_8$ alkyls, aryls and silyls, R being more preferably being selected from the group consisting of isopropyl, t-butyl and cyclohexyl. When R is selected from the group consisting of isopropyl, t-butyl and cyclohexyl, L is preferably an alkylnitrile, more preferably acetonitrile, while X preferably includes Cl.

A source reagent system for the formation of tungsten nitride films includes at least single imido one tungsten imido species having the formula $L_yW(NR)X_n$. R is an alkyl, aryl group or silyl group, y is an integer between 0 and 5, n is an integer between 0 and 4, $L_y$ and $X_n$ being selected from the group of non-imido ligands. The system includes a solvent to dissolve the single imido tungsten imido species. The solvent can be selected from the group consisting of benzonitrile, N-methylpyrrolidinone, dimethyl formamide (DMF), acetonitrile and dimethylacetamide (DMA), more preferably being benzonitrile.

A chemical vapor deposition system having a reactant delivery system for producing and delivering a precursor aerosol includes a reactor, structure for forming a precursor aerosol from a fluid including precursor molecules, and a precursor aerosol delivery conduit in fluid connection with an output of the structure for forming a precursor aerosol. The delivery conduit includes concentric tubes, where the precursor aerosol flows in an inner tube. A structure for controlling the temperature of the volume between the outside of the inner concentric tube and the inside of the outer concentric tube is provided. The reactor is fluidly connected to an output of the inner tube for receiving and decomposing the precursor aerosol.

The structure for forming a precursor aerosol can include a chamber having an input and an output, the chamber including a vibrating plate and structure for introduction of fluid to the chamber input, to form the precursor aerosol. The structure for controlling the temperature can include resistive wire or heat tape.

The system can include a perforated plate having a plurality of channels interposed between the inner tube and the reactor, the perforated plate for improving delivery of the aerosol precursor to the reactor. The diameter of the inner concentric tube increases as the inner concentric tube approaches the perforated plate.

A method for forming tungsten nitride layers on substrates includes the steps of providing at least one single imido tungsten imido species having the formula $L_yW(NR)X_n$, where R is a carbon containing group, y is an integer between 0 and 5, n is an integer between 0 and 4 and $L_y$ and $X_n$ are selected from the group of non-imido ligands. The single imido tungsten imido species is flowed to a surface of a substrate. The single imido tungsten imido species decomposes to form the tungsten nitride layer. A tungsten nitride barrier layer can be formed by this W method. The method can include the step of heating the substrate surface to a temperature of at least 300° C. and/or the step of vaporizing the single imido tungsten imido species to form a vapor, the vaporizing step before the flowing step. The flowing step can include flowing of a carrier gas, the carrier gas for aiding transport of the tungsten imido species to the substrate surface. Preferably, the carrier gas includes hydrogen ($H_2$).

The method can include the step of dissolving the single tungsten imido species with a solvent. The solvent is preferably selected from the group consisting of benzonitrile, N-methylpyrrolidinone, dimethyl formamide (DMF), acetonitrile and dimethylacetamide (DMA).

A source reagent composition system for the formation of tungsten nitride films includes at least single imido one tungsten imido species having the formula $L_yW(NR)X_n$, where R is a carbon containing group, y is an integer between 0 and 5, n is an integer between 0 and 4, $L_y$ and $X_n$ being selected from the group of non-imido ligands. R can be an alkyl, aryl or silyl group. L can be selected from the group consisting of $C_1$–$C_8$ alkylnitriles and arylnitriles.

BRIEF DESCRIPTION OF THE DRAWINGS

This invention may be better understood by referring to the following description taken in conjunction with the accompanying drawings, in which.

DETAILED DESCRIPTION OF PREFERRED EMBODIMENTS

Figure 1:
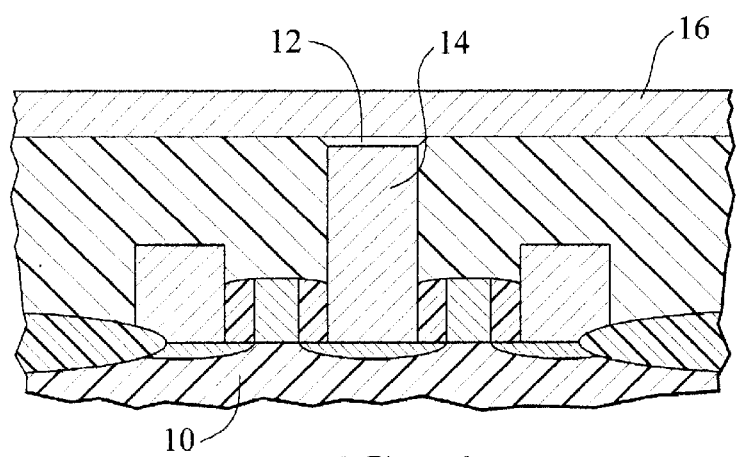
FIG. 1 is a cross section through a silicon device illustrating the use of a barrier material to isolate plug material.

Single imido tungsten imido complexes (TIC) are described which are particularly suitable for use in metal-organic chemical vapor deposition (MOCVD) to form barrier layers against the diffusion of metals such as Cu into underlying circuit structure. Single imido tungsten imido species are understood to represent tungsten molecules having only one occurrence of the structure (M=NR), where M is a metal (e.g. W), and = is a multiple bond to N. It is noted that W generally obeys the eighteen (18) electron rule, with W providing six (6) outer shell electrons of its own. Accordingly, in any instances where a general formula of a tungsten imido precursor does not appear to follow the eighteen (18) electron rule, it is to be understood that the single imido tungsten imido precursor generally derives additional electrons through donation of the lone pair on the N of the imido ligand to the W to satisfy its electron valence.

As used herein, L is used to represent ligands capable of donating two (2) electrons to W in the form of a coordinate bond with W. Thus, L provides two (2) electrons to the W valence. As used herein, X represents ligands which form covalent bonds with W. Thus, each X bond provides one shared electron to the W valence.

As used herein, the term "precursor delivery" when referred to metal organic chemical vapor deposition or other thin film or coating processes, refers to the fact that the precursor or source reagent composition for the material to be deposited on a substrate is vaporized from a liquid or solid form to produce a corresponding precursor vapor which then is transported to form the material film or coating on the substrate structure. If a liquid phase is vaporized to form the precursor vapor, the liquid phase may comprise a liquid-phase source reagent per se, or the source reagent may be dissolved in, or mixed with, a liquid to facilitate vaporization to place the source reagent in the vapor phase for the deposition operation.

As used herein, the term "perfluoroalkyl" is intended to be broadly construed in this application to include groups containing alkyl moieties which are partially or fully substituted with fluorine atoms, and thus perfluoroalkyl includes for example a trifluoroalkyl substituent whose alkyl moiety is $C_1$–$C_8$ alkyl, such as trifluoromethyl.

The $WN_x$ source reagents disclosed in this application include single imido tungsten imido complexes for the deposition of $WN_x$. By varying the structure of these precursor molecules, precursors can be optimized which readily dissociate at a relatively low temperature (e.g. 400–650° C.) with minimal contamination (e.g. O and C) within the $WN_x$ layer formed. Low temperature dissociation ensures compatibility with a broader range of layers used in microelectronic and electro-optic circuit fabrication.

The presence of impurities in the $WN_x$ layer (e.g. O, N, C) may not always be undesirable. Incorporation of O, N and C have been reported to improve stability in contact structures, because these impurities tend to "stuff" or fill grain boundaries and inhibit diffusion of metals such as Cu though the $WN_x$ layer. Although these impurities can stabilize the $WN_x$ film, they may also act as undesirable electron scattering sites reducing carrier mobility, thus increasing the resistivity of the $WN_x$ film.

Tungsten imido complexes can be light sensitive, and accordingly may dissociate if exposed to significant light intensities. Accordingly, the single imido tungsten imido complex material should be shielded from light during storage and processing. In one compositional aspect, the invention relates to a precursor composition comprising at least one single imido tungsten imido species, according to the following formulas:

i) Tungsten imido complexes of the formula:

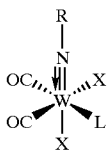

where R is H, Cl, $C_1$–$C_8$ alkyl (such as Me, Et, i-Pr, t-Bu, etc.), aryl (such as phenyl), $C_1$–$C_8$ perfluoroalkyl, silicon-containing groups of the type $SiR_1R_2R_3$ or nitrogen-containing groups of the type $NR_4R_5$. $R_1$–$R_5$ are each selected from H, Cl, $C_1$–$C_8$ alkyl (such as Me, Et, i-Pr, t-Bu, etc.), aryl (such as phenyl) and $C_1$–$C_8$ perfluoroalkyl.

X is F, Cl, Br, I or $N_3$.

L is $C_1$–$C_8$ alkylnitrile, arylnitrile, ether, cyclic ether (such as tetrahydrofuran), heterocyclic aromatic amine (such as pyridine and pyrrole), heterocyclic aliphatic amine (such as piperidine and pyrrolidine) or alkylamine ($NR_{11}R_{12}R_{13}$). $R_{11}$, $R_{12}$ and $R_{13}$ are each selected from H, $C_1$–$C_8$ alkyl (such as Me, Et, i-Pr, t-Bu, etc.), aryl (such as phenyl), $C_1$–$C_8$ perfluoroalkyl and silicon-containing groups of the type $SiR_{21}R_{22}R_{23}$. $R_{21}$, $R_{22}$ and $R_{23}$ are each selected from H, $C_1$–$C_8$ alkyl (such as Me, Et, i-Pr, t-Bu, etc.), aryl (such as phenyl) and $C_1$–$C_8$ perfluoroalkyl.

ii) Tungsten imido complexes of the formula:

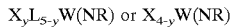

Where R is H, Cl, $C_1$–$C_8$ alkyl (such as Me, Et, i-Pr, t-Bu, cyclohexyl, etc.), aryl (such as phenyl), $C_1$–$C_8$ perfluoroalkyl, silicon-containing groups of the type $SiR_1R_2R_3$ or nitrogen-containing groups of the type $NR_4R_5$. $R_1$–$R_5$ are each selected from H, Cl, $C_1$–$C_8$ alkyl (such as Me, Et, i-Pr, t-Bu, cyclohexyl, etc.), aryl (such as phenyl) and $C_1$–$C_8$ perfluoroalkyl.

X is F, Cl, Br, I, $N_3$ or $NR_{11}R_{12}$. $R_{11}$ and $R_{12}$ are each selected from H. Cl, $C_1$–$C_8$ alkyl (such as Me, Et, i-Pr, t-Bu, etc.), aryl (such as phenyl), $C_1$–$C_8$ perfluoroalkyl, silicon-containing groups of the type $SiR_{13}R_{14}R_{15}$ and nitrogen-containing groups of the type $NR_{16}R_{17}$. $R_{13}$–$R_{17}$ are each selected from H, Cl, $C_1$–$C_8$ alkyl (such as Me, Et, i-Pr, t-Bu, etc.), aryl (such as phenyl) and $C_1$–$C_8$ perfluoroalkyl. y is 2, 3 or 4.

L is $C_1$–$C_8$ alkylnitrile, arylnitrile, ether, cyclic ether (such as tetrahydrofuran), heterocyclic aromatic amine (such as pyridine, pyrrole), heterocyclic aliphatic amine (such as piperidine, pyrrolidine) or alkylamine ($NR_{21}R_{22}R_{23}$). $R_{21}$, $R_{22}$ and $R_{23}$ are each selected from H. $C_1$–$C_8$ alkyl (such as Me, Et, i-Pr, t-Bu, etc.), aryl (such as phenyl), $C_1$–$C_8$ perfluoroalkyl and silicon-containing groups of the type $SiR_{24}R_{25}R_{26}$. Each of $R_{24}$, $R_{25}$ and $R_{26}$ are selected from H, $C_1$–$C_8$ alkyl (such as Me, Et, i-Pr, t-Bu, etc.), aryl (such as phenyl) and $C_1$–$C_8$ perfluoroalkyl.

A preferred single imido tungsten imido complex group has the formula $X_yL_{5-y}W(NR)$, where y=4. A most preferred reagent sub-group from the preferred reagent group is when R is selected from the group consisting of isopropyl, t-butyl and cyclohexyl, and most preferably isopropyl, $X_{1-4}$ being Cl, and NR being acetonitrile ($NCCH_3$). The preferred solvent for above preferred single imido tungsten imido complex is benzonitrile.

iii) Tungsten imido complexes of the formula:

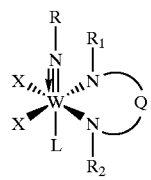

where R, $R_1$ and $R_2$ are each selected from H, Cl, $C_1$–$C_8$ alkyl (such as Me, Et, i-Pr, t-Bu, cyclohexyl, etc.), aryl (such as phenyl), $C_1$–$C_8$ perfluoroalkyl, silicon-containing groups of the type $SiR_3R_4R_5$ and nitrogen-containing groups of the type $NR_6R_7$. $R_3$–$R_7$ are each selected from H, Cl, $C_1$–$C_8$ alkyl (such as Me, Et, i-Pr, t-Bu, etc.), aryl (such as phenyl), $C_1$–$C_8$ perfluoroalkyl.

X is F, Cl, Br, I, $N_3$ or $NR_{11}R_{12}$. $R_{11}$ and $R_{12}$ are each selected from H, Cl, $C_1$–$C_8$ alkyl (such as Me, Et, i-Pr, t-Bu, etc.), aryl (such as phenyl), $C_1$–$C_8$ perfluoroalkyl, silicon-containing groups of the type $SiR_{13}R_{14}R_{15}$ and nitrogen-containing groups of the type $NR_{16}R_{17}$. $R_{13}$–$R_{17}$ are each selected from H, Cl, $C_1$–$C_8$ alkyl (such as Me, Et, i-Pr, t-Bu, etc.), aryl (such as phenyl) and $C_1$–$C_8$ perfluoroalkyl.

Q is $(CH_2)_2$, $(CH_2)_3$ or CH=CH.

L is $C_1$–$C_8$ alkylnitrile, arylnitrile, ether, cyclic ether (such as tetrahydrofuran), heterocyclic aromatic amine (such as pyridine, pyrrole), heterocyclic aliphatic amine (such as piperidine, pyrrolidine) or alkylamine ($NR_{21}R_{22}R_{23}$). $R_{21}$, $R_{22}$ and $R_{23}$ are each selected from H, $C_1$–$C_8$ alkyl (such as Me, Et, i-Pr, t-Bu, etc.), aryl (such as phenyl), $C_1$–$C_8$ perfluoroalkyl and silicon-containing groups of the type $SiR_{24}R_{25}R_{26}$. $R_{24}$, $R_{25}$ and $R_{26}$ are each selected from $C_1$–$C_8$ alkyl (such as Me, Et, i-Pr, t-Bu, etc.), aryl (such as phenyl) and $C_1$–$C_8$ perfluoroalkyl. L may also be an empty coordination site with no ligand.

iv) Tungsten imido complexes of the formula:

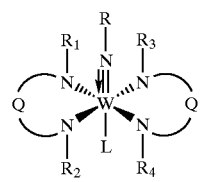

where R, $R_1$–$R_4$ are each selected from H, Cl, $C_1$–$C_8$ alkyl (such as Me, Et, i-Pr, t-Bu, cyclohexyl, etc.), aryl (such as phenyl), $C_1$–$C_8$ perfluoroalkyl, silicon-containing groups of the type $SiR_5R_6R_7$ and nitrogen-containing groups of the type $NR_8R_9$. $R_5$–$R_9$ are H, Cl, $C_1$–$C_8$ alkyl (such as Me, Et, i-Pr, t-Bu, etc.), aryl (such as phenyl), $C_1$–$C_8$ perfluoroalkyl.

Q is $(CH_2)_2$, $(CH_2)_3$ or CH=CH.

L is $C_1$–$C_8$ alkylnitrile, arylnitrile, ether, cyclic ether (such as tetrahydrofuran), heterocyclic aromatic amine (such as pyridine, pyrrole), heterocyclic aliphatic amine (such as piperidine, pyrrolidine) or alkylamine ($NR_{11}R_{12}R_{13}$). $R_{11}$, $R_{12}$ and $R_{13}$ are each selected from H, $C_1$–$C_8$ alkyl (such as Me, Et, i-Pr, t-Bu, etc.), aryl (such as phenyl), $C_1$–$C_8$ perfluoroalkyl and silicon-containing groups of the type $SiR_{14}R_{15}R_{16}$. $R_{14}$, $R_{15}$ and $R_{16}$ are each selected from H, $C_1$–$C_8$ alkyl (such as Me, Et, i-Pr, t-Bu, etc.), aryl (such as phenyl) and $C_1$–$C_8$ perfluoroalkyl. L may also be an empty coordination site with no ligand.

v) Tungsten imido complexes of the formula:

$$\begin{array}{c} R \\ | \\ N \\ X_{\prime\prime\prime\prime}\!\!\!-\!\!\!W\!\!\!-\!\!\!X \\ X \diagup | \diagdown N\!\!-\!\!R_1 \\ | \quad ) \\ R_3\!\!-\!\!N\!\!-\!\!Q \\ | \\ R_2 \end{array}$$

where R, $R_1$–$R_3$ are each selected from H, Cl, $C_1$–$C_8$ alkyl (such as Me, Et, i-Pr, t-Bu, cyclohexyl, etc.), aryl (such as phenyl), $C_1$–$C_8$ perfluoroalkyl, silicon-containing groups of the type $SiR_5R_6R_7$ and nitrogen-containing groups of the type $NR_8R_9$. $R_5$–$R_9$ are each selected from H, Cl, $C_1$–$C_8$ alkyl (such as Me, Et, i-Pr, t-Bu, etc.), aryl (such as phenyl) and $C_1$–$C_8$ perfluoroalkyl.

X is F, Cl, Br, I, $N_3$ or $NR_{11}R_{12}$ $R_{11}$ and $R_{12}$ are each selected from H, Cl, $C_1$–$C_8$ alkyl (such as Me, Et, i-Pr, t-Bu, etc.), aryl (such as phenyl), $C_1$–$C_8$ perfluoroalkyl, silicon-containing groups of the type $SiR_{13}R_{14}R_{15}$ and nitrogen-containing groups of the type $NR_{16}R_{17}$. $R_{13}$–$R_{17}$ are each selected from H, Cl, $C_1$–$C_8$ alkyl (such as Me, Et, i-Pr, t-Bu, etc.), aryl (such as phenyl) and $C_1$–$C_8$ perfluoroalkyl.

Q is $(CH_2)_2$ or $(CH_2)_3$.

In another aspect of the invention, a method for forming a tungsten nitride layer on a substrate, such as silicon, from a single imido tungsten imido precursor reagent is disclosed. The method includes the steps of vaporizing the precursor to form a precursor vapor, contacting the precursor vapor with a substrate under deposition conditions, such as chemical vapor deposition (CVD), to deposit $WN_x$ on the substrate. The single imido tungsten imido precursor has the formula $L_yW(NR)X_n$, wherein R is a carbon containing group, y is an integer between 0 and 5, n is an integer between 0 and 4 and $L_y$ and $X_n$ are selected from the group of non-imido ligands. The precursor decomposes under the deposition conditions to form a tungsten nitride layer.

It is generally necessary to provide a stream of gaseous precursor molecules to form $WN_x$ layers. If volatilization of the precursor is desired, any suitable method for volatilizing the precursors can be used with the precursors described in the invention.

For CVD of WN-based films or coatings on a substrate, the corresponding source reagent may be provided as a liquid or solid starting material, which can then be vaporized to form a precursor vapor for CVD. The vaporization may be carried out by injection of liquid precursor in fine jet, mist or droplet form into a hot zone at an appropriate temperature for vaporization of the source reagent liquid. Such injection may be carried out with a nebulization or atomization apparatus of conventional character, producing a dispersion of finely divided liquid particles, such as sub-micron to millimeter diameter scale particles. The dispersed liquid particles may be directed at a substrate at a sufficiently high temperature to decompose the source reagent and produce a coating of the $WN_x$ layer on the substrate.

Certain desirable reagents, such as some single imido tungsten precursors for $WN_x$ formation cannot be delivered in sufficient concentrations in gaseous form due to low vapor pressures. Some useful single imido tungsten reagents may also be solids. Solid source delivery systems may be used, but usually produce low gaseous output. Alternatively, a solid reagent may be dissolved in an appropriate solvent and nebulized.

A reactant delivery system for producing and delivering a precursor aerosol, can include a structure for forming a precursor aerosol from a fluid including precursor molecules, and a precursor aerosol delivery conduit in fluid connection with an output of the structure for forming a precursor aerosol. The delivery conduit can include concentric tubes comprising an inner and an outer tube, where the precursor aerosol flows in the inner tube. A structure for controlling the temperature of a volume between the outside of the inner concentric tube and the inside of an outer concentric tube can be provided.

A reactor (e.g. CVD) can be fluidly connected to the output of an inner tube to receive and react reagents such as single imido tungsten imido precursors which are delivered to the reactor by the reactant delivery system. Such a delivery system, and any reactor using such a delivery system, can use the precursor aerosol delivery system for a broad range of precursors, the range of applicable precursors not limited to the single imido tungsten imido precursors disclosed herein.

Figure 2:
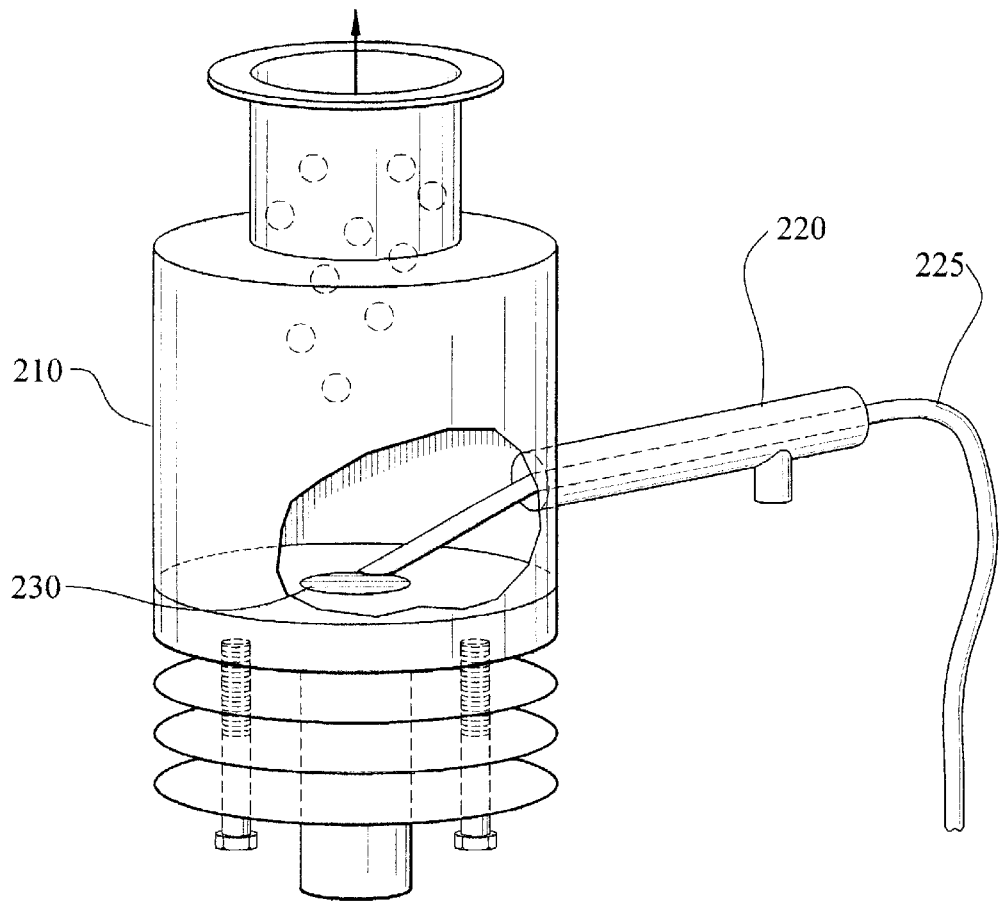
FIG. 2 is a schematic illustration of a nebulizer system.

A precursor nebulizer system 200 is shown in FIG. 2. If the precursor is a solid at room temperature, such materials may first be dissolved in a liquid solvent to allow volatilization in a nebulizer or similar apparatus. Examples of helpful solvents include, but are not limited to, anhydrous benzonitrile, N-methylpyrrolidinone, dimethylformamide (DMF), acetonitrile and dimethylacetamide (DMA).

In a preferred embodiment, a nebulizer 210 can be used to convey solvent along with dissolved precursor in its monomer (neither dissociated nor dimerized) form to a reactor, such as a low pressure chemical vapor deposition (LPCVD) reactor. Liquid enters the nebulizer 210 through a suitable conduit 220. For example, plastic tubing can be used for this purpose. Liquid can travel inside the tubing 225, while carrier gas flows around the tubing through the injection line 220. When the liquid reaches the nebulizer, it contacts a quartz plate 230. The quartz plate 230 in the bottom of the nebulizer vibrates at high frequency. Based on the piezoelectric effect, an "aerosol" of solvent/precursor is formed. The droplets formed are then lifted upward and can be conveyed to the inlet of a flow conduit (not shown), such as an impinging jet, by a carrier gas. No co-reagents are generally required, although certain co-reagents can be expected to improve $WN_x$ film properties. For example, $NH_3$ can be used to increase the nitrogen content of a $WN_x$ layer formed by deposition methods such as chemical vapor deposition (CVD). Hydrogen ($H_2$) can be used to lower the impurity concentration in the $WN_x$ layer.

Figure 3A:
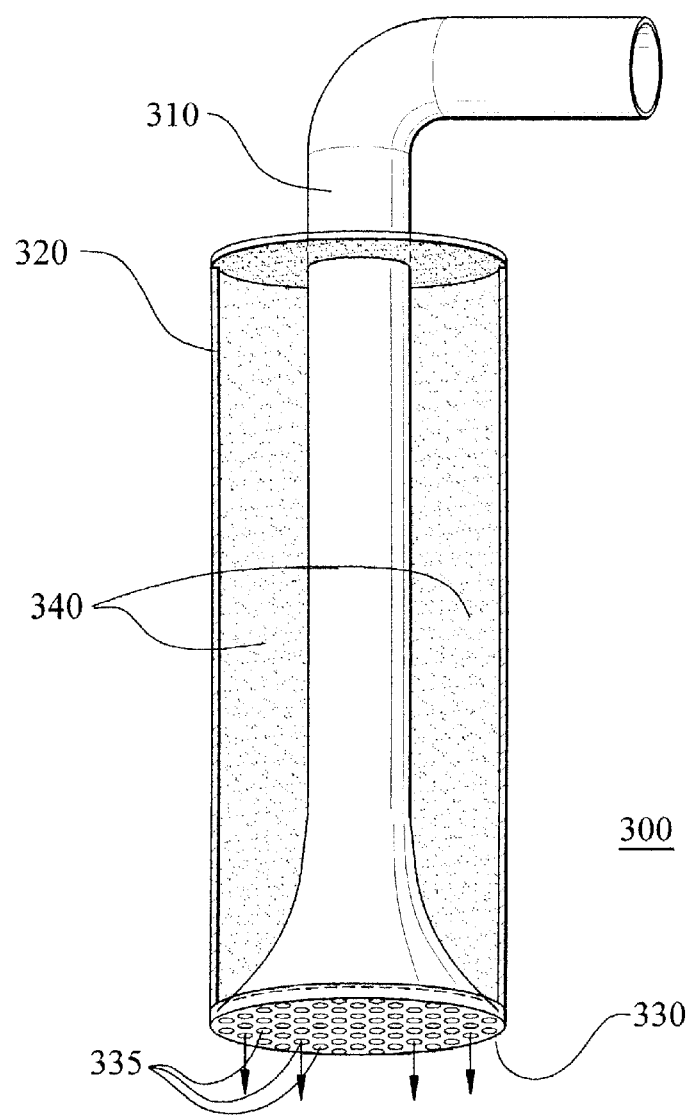
FIG. 3(a) is a schematic illustrating a double tube impinging jet aerosol reactant transfer conduit apparatus including a perforated plate.
Figure 3B:
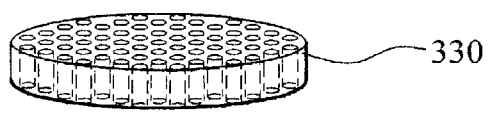
FIG. 3(b) illustrates a side view of the perforated plate shown in FIG. 3(a).

A double tube impinging jet arrangement 300 for delivering aerosol precursors following volatilization is shown in FIG. 3(*a*). The primary function of the double tube impinging jet 300 is to maintain the precursor in aerosol form and avoid condensation of the precursor and also avoid separation of the solvent from the precursor and dissociation of the precursor. Thus, the length of the impinging jet should be maintained at a temperature high enough to avoid condensing the precursor, but low enough to avoid separating the solvent from the precursor and dissociating the precursor.

The precursor vapor flows through the inner tube 310, while the gap between the inner 310 and outer tube 320 may be suitably heated to maintain the desired temperature by use of resistive wire or heating tape 340, for example. In a preferred embodiment inner tube 310 has a 0.5 inch diameter, which outer tube 320 has a 1.25 inch diameter. The tube 310 guides the precursor past cool regions in its flow path, such as water cooled flanges of a CVD process tube. The outlet of the impinging jet can discharge directly into a reactor, or the distance between the impinging jet and the reactor can be varied for optimization.

Near the bottom of the jet 300, the inner tube 310 is preferably flared out to the diameter of the outer tube 320. A plate on the bottom of the jet 330 can be provided a plurality of flow channels 335, as shown in FIG. 3(*a*). The central ring has holes directed outward, while the outer ring has holes directed straight down. FIG. 3(*b*) shows a side view of the perforated plate 330. The flared tube design makes the orifice opening at the end of the jet more gradual, and the hole orientation helps distribute the precursor to the reactor. The combination of the flared tube 310 and hole orientations in the perforated plate 330 functions to improve the uniformity of precursor delivery to the substrate and minimizes end effects, which can cause recirculatory convection patterns in the reactor. The double tube impinging jet 300 largely avoids the tendency for the precursor solution to condense as it passes through cool regions in its path into the reactor. Condensation of the precursor solution can result in precursor flowing down the walls of the reactor tube and results in minimal precursor transport to the substrates, and accordingly little or no $WN_x$ deposition.

A controlled delivery device, such as a syringe pump, can be used to deliver controlled amounts of liquid precursor reagents to a piezoelectric quartz plate located in the nebulizer chamber. A suitable power supply causes the piezoelectric quartz plate to oscillate at a given frequency. An ultrasonic nebulizer aerosol unit directs carrier gas flow adjacent to the quartz plate to propel the precursor aerosol out of the nebulizer chamber.

A typical precursor/solvent solution flow into the nebulizer is approximately 3–5 mL/hour. Power to the nebulizer can be varied with the use of a variable transformer, which can be used to vary the oscillation frequency. Typical oscillation frequencies used are from 1–4 MHZ.

Carrier gas is generally necessary to transport the precursor gas into a reactor. Accordingly, the carrier gas selected should preferably have high thermal conductivity (approximately 10 mW/m-K at 300° K. or greater) to ensure a more uniform and extended temperature profile inside the reactor above the substrates. Nitrogen can be used to increase the nitrogen content of the $WN_x$ films. However, the introduction of significant additional nitrogen within $WN_x$ films from the carrier flow is unlikely because $N_2$ only dissociates appreciably at temperatures of at least approximately 1000° C., far above the preferred deposition temperature range of 450–650° C. Alternatively or in combination with $N_2$, ammonia ($NH_3$) and Hydrogen ($H_2$) can also be used as a carrier gas. Hydrogen carrier gas may permit the use of a lower deposition temperature as compared to nitrogen carrier gas, and may also improve the surface smoothness of the $WN_x$ film formed.

There are many alternatives to the use of a nebulizer to volatize precursor molecules. For example, liquid precursor reagent may be dispensed from a suitable supply vessel onto a heat element, such as a screen, grid, or similar structure. The structure is heated to a sufficiently high temperature to cause the liquid to flash volatilize into the vapor phase, as for example in the manner described in U.S. Pat. No. 5,206,314 to Kirlin et al., and U.S. Pat. No. 5,711,816 to Kirlin et al., which are both hereby incorporated by reference into this application.

As an alternative to the use of the source reagent in the liquid form, the source reagent may be dissolved or mixed into a compatible solvent medium that does not preclude the efficacy of the resulting composition of MOCVD usage. For example, the source reagent may be utilized in a solvent composition of the type disclosed in the U.S. Pat. No. 5,820,664, to Gardiner et al., which is hereby incorporated by reference into this application. The resulting solution or suspension of the source reagent and solvent mixture may then be injected, dispersed, flash vaporized, or otherwise volatilized in any suitable manner.

Regardless of the manner of volatilizing the source reagent, the vapor thereof is flowed to contact the substrate on which the $WN_x$–based material is to be deposited, at an appropriate temperature and pressure. Reactor temperature ranges from 300 to 800° C. A preferred reactor temperature range is from 450 to 650° C. Deposition pressure ranges from approximately 1 to 760 Torr. Deposition pressure depends on variables, such as but not limited to, reactant flow, carrier flow, pumping rate, reactor temperature, reaction rate, and reactant used.

It was found that for some single imido tungsten precursors deposition pressures generally below approximately 150 Torr resulted in precursor/solvent separation resulting from the solvent preferentially volatilizing at low pressures leaving behind precursor material in the nebulizer housing unit. Thus, reactor pressures should be set high enough to avoid the solvent preferentially volatizing and leaving behind precursor material prior to delivery into the reactor.

Other types of reactors other than RF heated (such as horizontal reactor heated by either RF induction, resistive heating, or lamps) may be used with the invention. PECVD may also be used with the invention provided the plasma generated does not adversely affect the dissociation/ regeneration of the $WN_x$ precursors used.

Typical deposition rates for the $WN_x$ deposition process are 1.0–25 $\mu$m/hr depending mainly on the tungsten imido precursor used and the flowrate of the precursor/solvent solution to the nebulizing unit. In the preferred embodiment, a high $N_2$ carrier gas flow rate, typically 750 sccm, is used to improve transport of the aerosol precursor solution from the nebulizer (or equivalent structure for vaporizing) output to the reactor. Temperature can also be used to control the deposition rate.

The expected thin film resistivity ranges of the $WN_x$ thin films are from 15–5000 $\mu$ ohm-cm. The resistivity value depends on variables such as the degree of $WN_x$ crystallinity, the impurity incorporation (i.e. carbon and oxygen contamination which each raise the resistivity) and the thickness of the deposited $WN_x$ film. Film resistivity equals the sheet resistance of the film (in units of ohms/sq) multiplied by the film's thickness.

It is preferable to form a $WN_x$ layer that is amorphous, or nearly amorphous, to minimize diffusion pathways created by grain boundaries between individual crystals in a polycrystalline $WN_x$ layer. Lower deposition temperatures generally produce increasingly amorphous $WN_x$ layers. Selection of appropriate precursor and solvent combinations may result in significant carbon inclusion within the $WN_x$ film, carbon inclusion generally resulting in the formation of a more amorphous film.

Various methods can be used to analyze the $WN_x$ layer formed. For example, confirmation of both WN and $W_2N$ compounds can be obtained using X-ray diffraction (XRD), scanning electron microscopy (SEM), and Auger electron spectroscopy (AES). Scanning electron microscopy can also be used to assess surface morphology.

EXAMPLES

Example 1

Synthesis of $Cl_4(CH_3CN)WN$-i-Pr

Single imido tungsten imido complexes may be conveniently synthesized by a variety of methods. For example, a method for synthesizing a single imido tungsten imido precursor having the formula $Cl_4(CH_3CN)WN$-i-Pr is detailed below. An orange slurry of $WOCl_4$ (3.41 g, 10 mmol) and i-PrNCO (1.57 mL, 16 mmol) in 60 mL of heptane was heated with stirring at 100° C. for 2 days. After this time, a dark red solution and red crystals were obtained. The solvent was removed in vacuo and the solid was redissolved in 20 mL of acetonitrile. After stirring for 2 hr at room temperature, the brown solution was filtered and the solvent evaporated to yield 3.7 g of brown crystals. The yield was 88%. $^1$H NMR ($CDCl_3$): δ 1.67 (d, 6H), 2.49 (s, 3H), 7.07 (m, 1H). $^{13}$C NMR ($CDCl_3$): δ3.35, 23.12, 68.52, 118.37. IR ($CH_2Cl_2$): 2319, 2282, 1462, 1452, 1386, 1366, 1310, 1271, 1154, 1108, 1075 cm$^{-1}$. The above, or other tungsten imido precursors, may be synthesized by methods analogous to the one shown above, or through alternate synthesis techniques known in the art.

Example 2

A Precursor Vapor Delivery System

Examples of components used for implementing a precursor vapor delivery system capable of delivering tungsten imido vapors to remote location for further processing (e.g. CVD reactor) are as follows:
1. Syringe pump: Cole-Parmer Instruments Company, 625 East Bunker Court, Vernon Hills, Ill. 60061, 74900 series; rate 0.2 mL/hr to 500 mL/hr.
2. Power supply to nebulizer: Cetac Technologies, Inc., 5600 South 42nd Street Omaha, Nebr. 68107, ATX-100 series; Vibrates at frequency of 1.44 MHz, unless a variable transformer is used.
3. Ultrasonic nebulizer aerosol unit: Cetac Technologies, Inc., U-5000AT series. Custom modified to include ¼" port above quartz plate for sweeping carrier gas flow.
4. Syringe: Hamilton Company, Reno, Nev. 89520–0012, 10 ml sample-lock syringe; Model 1010SL.
5. Back pressure regulator, Upchurch Scientific Company; 619 West Oak Street Oak Harbor, Wash. 98277, Model U-605; 40 psi BPR cartridge in stainless steel assembly.
6. The double tube impinging jet shown in FIG. 3(a) for delivering vapors output from the nebulizer to a reactor.

Example 3

$WN_x$ was formed in a MOCVD reactor using a $Cl_4(CH_3CN)WN$-i-Pr precursor formed by the synthesis method of Example 1, and the tungsten imido precursor vapor delivery system of Example 2. The above tungsten imido complex having the $Cl_4(CH_3CN)WN$-i-Pr can be classified into the general formula $X_yL_{5-y}W(NR)$, where y=4, $X_{1-4}$=Cl, R=isopropyl and L=acetonitrile ($CH_3CN$). The above TIC was dissolved in a benzonitrile solvent. The syringe/nebulizer delivery system was used to carry the tungsten complex into a MOCVD reactor at a temperature of 575–600° C. for 150 minutes. Unpatterned silicon substrates were used. The deposition pressure was approximately 350 torr. The $WN_x$ layer formed had a measured thickness of 14 μm, representing a growth rate of approximately 940 Å/min. The bulk resistivity was measured at 164 μΩ-cm.

Figure 4A:
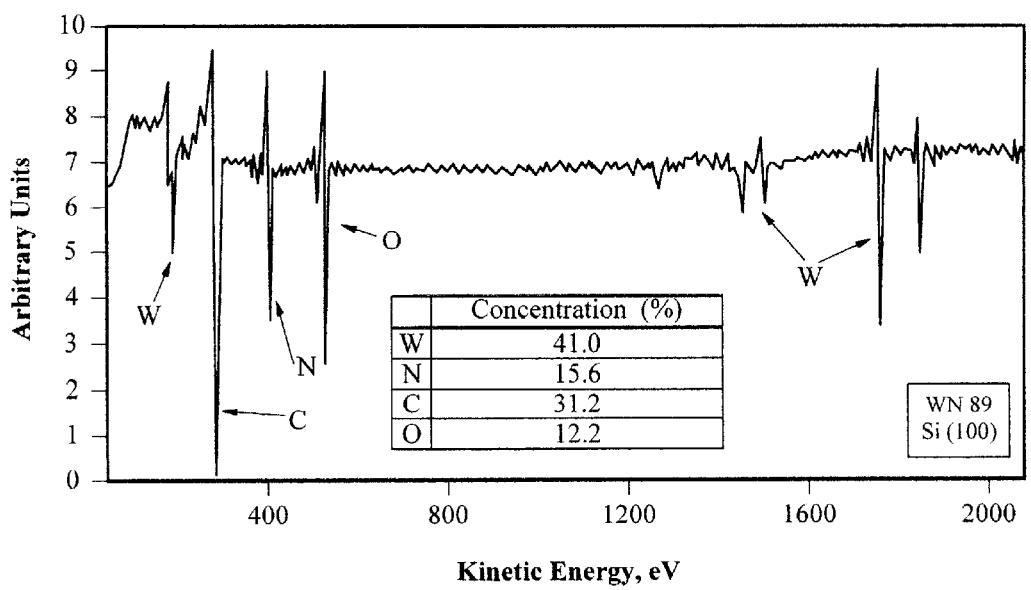
FIGS. 4(a) and 4(b) illustrate an AES spectral pattern for a $WN_x$ layer deposited using CVD on a silicon substrate.
Figure 4B:
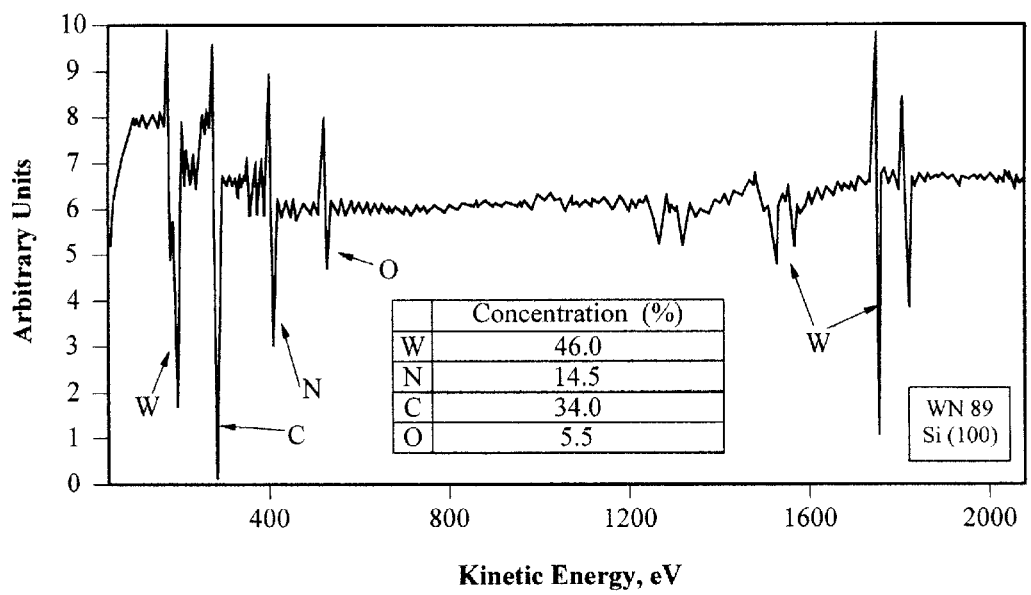

A semi-quantitative elemental analysis was obtained using Auger electron spectroscopy (AES). Due to the shallow penetration depth of this technique, only the first few film mono-layers were probed. The composition of the $WN_x$ surface is shown in FIG. 4(a), while composition of a $WN_x$ sub-surface layer reached by sputtering for approximately 0.5 minutes is shown in FIG. 4(b). The results demonstrate a tungsten rich film with significant carbon inclusion. Carbon content in the deposited $WN_x$ film may not be a problem for barrier performance, as it can improve barrier integrity, provided the carbon does not raise the $WN_x$ resistivity to a level which will significantly degrade circuit performance, based on the specific circuit application.

Auger plots shown in FIGS. 4(a) and 4(b) demonstrate the deposited $WN_x$ layer had approximately 40–45% W and approximately 15% N. Unless otherwise noted, % of elements reported by Auger are atomic %. The deposited layer also includes approximately 5–10% O and 30–35% C. Furthermore, it should be noted that other researchers have observed the preferential removal of nitrogen atoms and incorporation of carbon impurities by the incident Auger sputter ion beam. Therefore, it is possible that the actual nitrogen and carbon elemental compositions are higher and lower, respectively, than those reported by the AES results shown in FIGS. 4(a) and 4(b).

Figure 5:
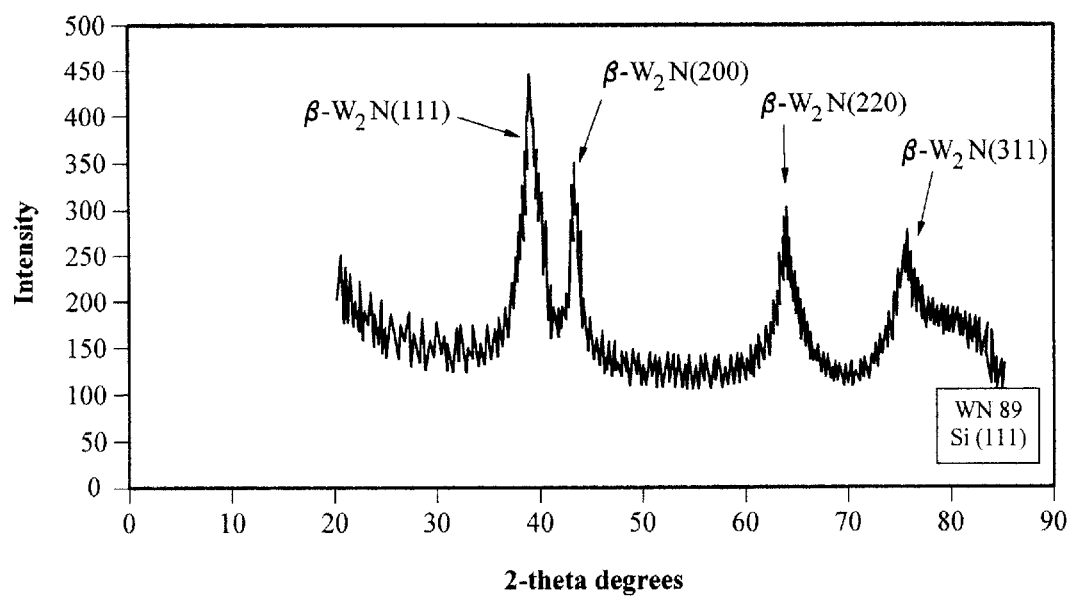
FIG. 5 illustrates an XRD pattern for $WN_x$ layer analyzed using AES in FIGS. 4(a) and 4(b).

FIG. 5 shows an XRD pattern for the $WN_x$ sample formed by the method and conditions described in example 3. FIG. 5 indicates the presence of polycrystalline $WN_x$ in the film, the $WN_x$ layer having no discernable preferred crystalline orientation.

Example 4

$WN_x$ was formed in a MOCVD reactor using a single imido tungsten imido complex of the formula $Cl_4(CH_3CN)WN$-t-butyl. This precursor has the general formula $X_yL_{5-y}W(NR)$, where y=4, $X_{1-4}$=Cl, R=t-butyl and L=acetonitrile. The precursor was dissolved in a benzonitrile solvent. A syringe/nebulizer delivery system was used to carry the tungsten complex into a MOCVD reactor at a temperature of 700° C. for 150 minutes. Unpatterned silicon substrates were used. The deposition pressure was approximately 760 torr. The $WN_x$ layer formed had a thickness of 50 μm, representing a growth rate of approximately 3500 Å/min. The bulk resistivity was measured at 1870 μΩ-cm.

Figure 6A:
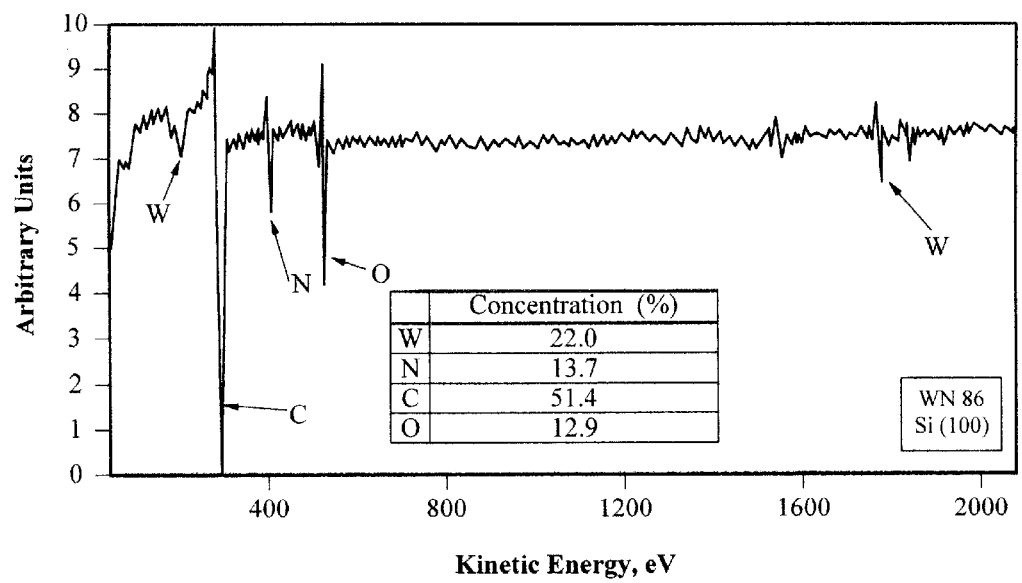
FIGS. 6(a) and 6(b) illustrate an AES spectral pattern for a $WN_x$ layer deposited using CVD on a silicon substrate.
Figure 6B:
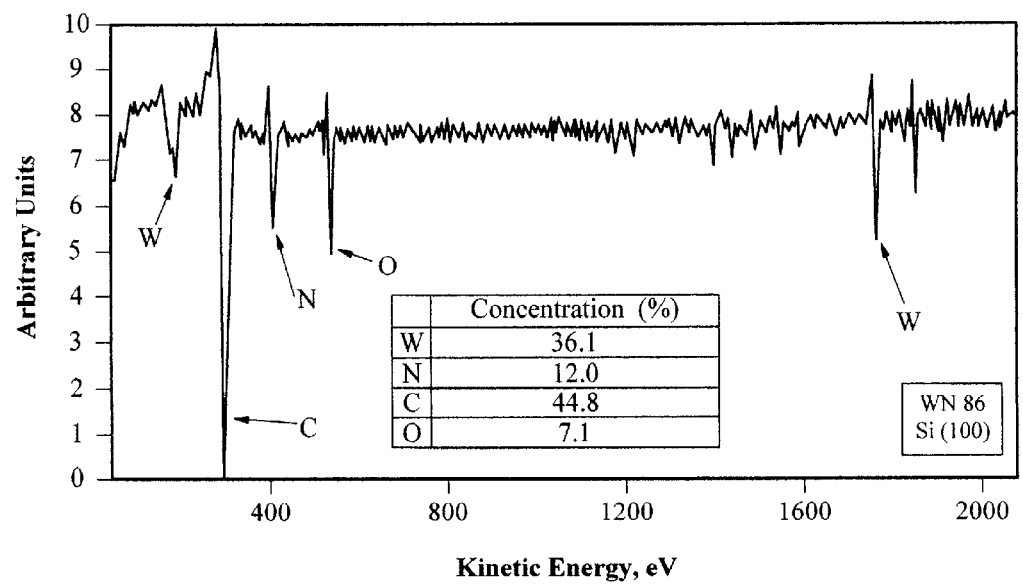

AES plots of the composition of the resulting $WN_x$ layer are shown in FIGS. 6(a) and 6(b). FIG. 6(a) shows the composition at the surface, while FIG. 6(b) shows the $WN_x$ composition at the sub-surface layer reached by sputtering for approximately 0.5 minutes. As can be seen from FIGS. 6(a) and 6(b), the $WN_x$ layer had approximately 20–35% W and approximately 10–15% N. The deposited layer also included approximately 5–15% O and 45–52% C.

Figure 7:
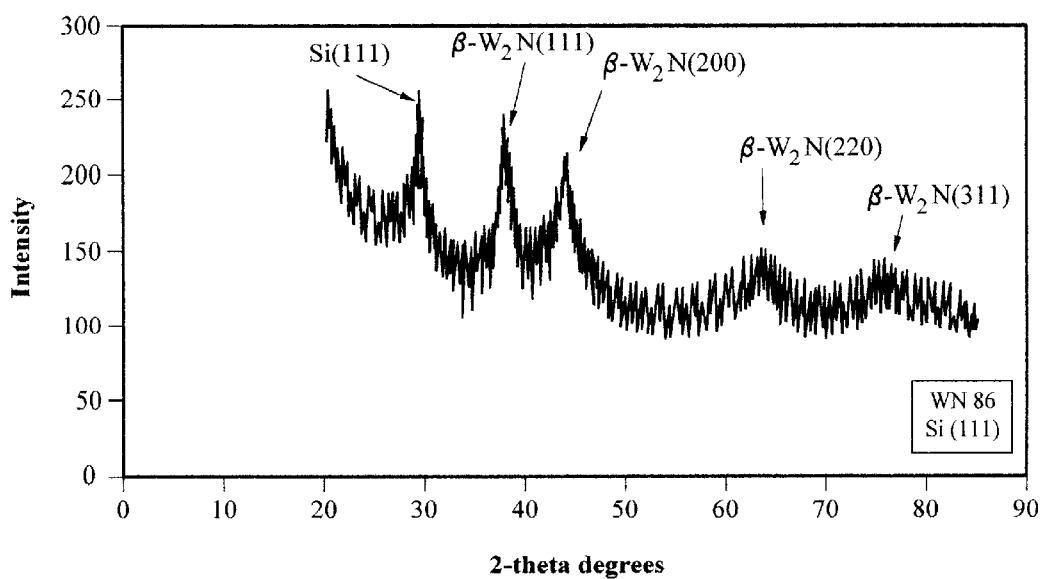
FIG. 7 illustrates an XRD pattern for $WN_x$ layer analyzed using AES in FIGS. 6(a) and 6(b).

FIG. 7 shows the $WN_x$ layer formed was polycrystalline, having no discernable preferred crystalline orientation. The presence of a large silicon (111) peak is not unexpected or undesirable, since for diffusion barrier purposes the barrier layer should be functional with 50–200 Å approximate film thickness. Given the greater penetration depth of x-rays compared to electrons, even complete surface coverage would result in detection of the underlying silicon for relatively thin $WN_x$ films.

Example 5

$WN_x$ was formed in a MOCVD reactor using a single imido tungsten imido complex $Cl_4(CH_3CN)WN$-cyclohexyl. This precursor has the general formula $X_yL_{5-y}W(NR)$, where y=4, $X_{1-4}$=Cl, R=cyclohexyl and L=acetonitrile. The precursor was dissolved in a benzonitrile solvent. A syringe/nebulizer delivery system was used to carry the tungsten complex into a MOCVD reactor at a temperature of 575° C. for 150 minutes. Unpatterned silicon substrates were used. The deposition pressure was approximately 350 torr. The $WN_x$ layer formed had a thickness of 13.5 μm, representing a growth rate of approximately 900 Å/min. The bulk resistivity was measured at 2016 μΩ-cm.

Figure 8A:
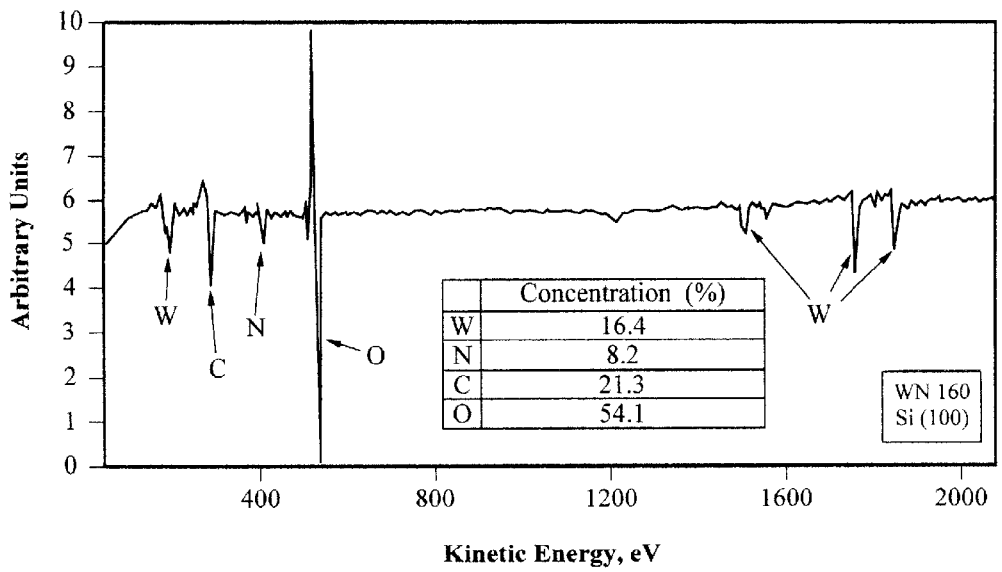
FIGS. 8(a) and 8(b) illustrate an AES spectral pattern for a $WN_x$ layer deposited using CVD on a silicon substrate.
Figure 8B:
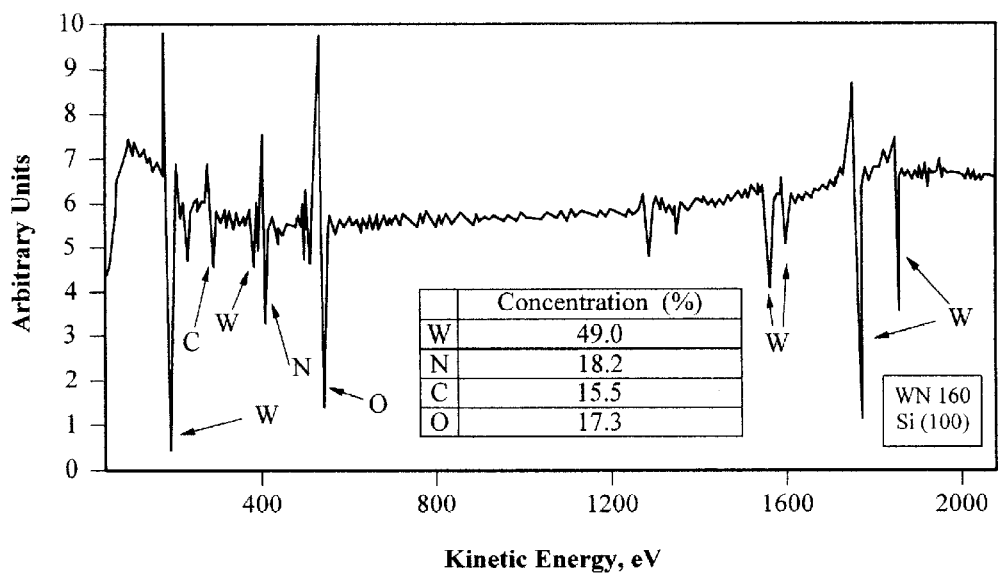

AES plots of the composition of the resulting $WN_x$ layer are shown in FIGS. 8(a) and 8(b). FIG. 8(a) shows the composition at the surface, while FIG. 8(b) shows the $WN_x$ composition at the sub-surface layer reached by sputtering for approximately 1.0 minute. As can be seen from FIGS. 8(a) and 8(b), the $WN_x$ layer had approximately 16% W, 8% N and 21% C, 54% O at the surface, while the composition of the $WN_x$ layer reached after a 1.0 minute sputter was 49% W, 18% N and 15% C and 17% O.

Figure 9:
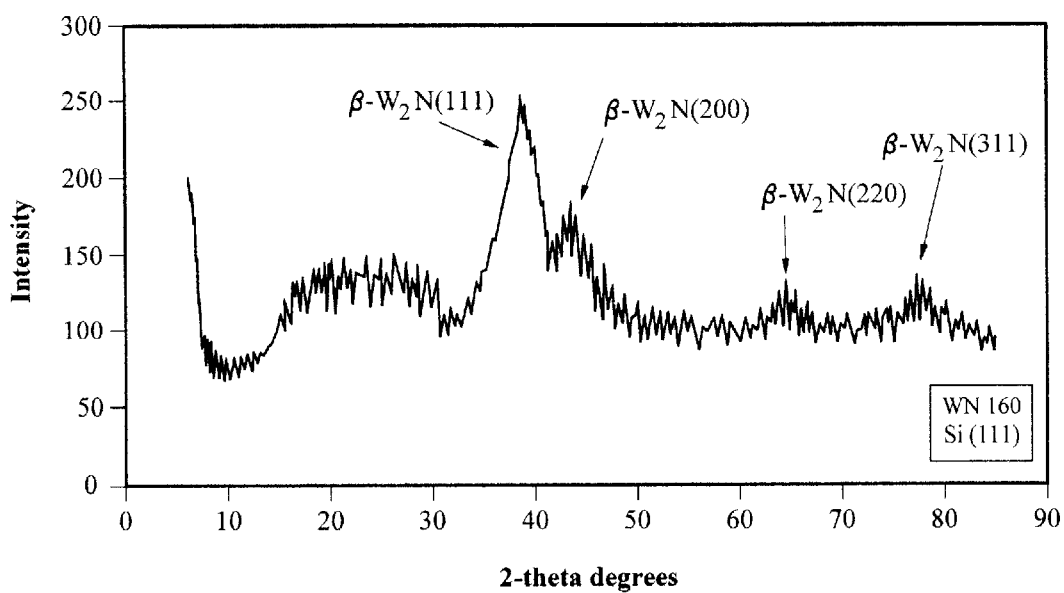
FIG. 9 illustrates an XRD pattern for $WN_x$ layer analyzed using AES in FIGS. 8(a) and 8(b).

FIG. 9 shows the $WN_x$ layer formed was polycrystalline, having no discernable preferred crystalline orientation.

Example 6

$WN_x$ was formed in a MOCVD reactor using a single imido tungsten imido complex of the formula $X_yL_{5-y}W$ (NR), where y=4, $X_{1-4}$=Cl, R=isopropyl and L=acetonitrile (same single imido tungsten imido complex as in Example 1). The precursor was dissolved in a N-methylpyrrolidinone solvent. A syringe/nebulizer delivery system was used to carry the tungsten complex into a MOCVD reactor at a temperature of 550° C. for 150 minutes. Unpatterned silicon substrates were used. The deposition pressure was approximately 350 torr. The $WN_x$ layer formed had a thickness of 3 μm, representing a growth rate of approximately 203 Å/min. The bulk resistivity was not measured.

Figure 10A:
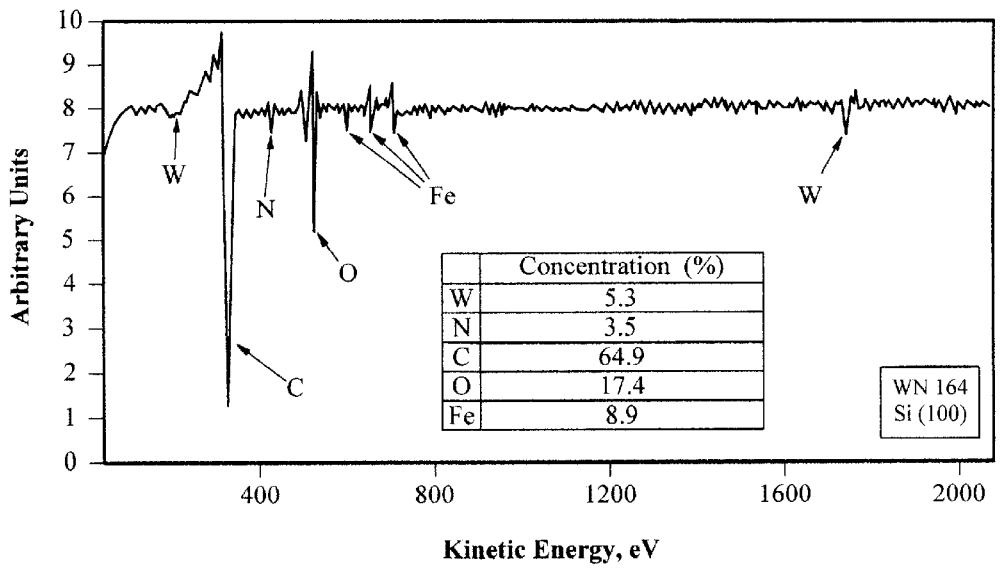
FIGS. 10(a) and 10(b) illustrate an AES spectral pattern for a $WN_x$ layer deposited using CVD on a silicon substrate.
Figure 10B:
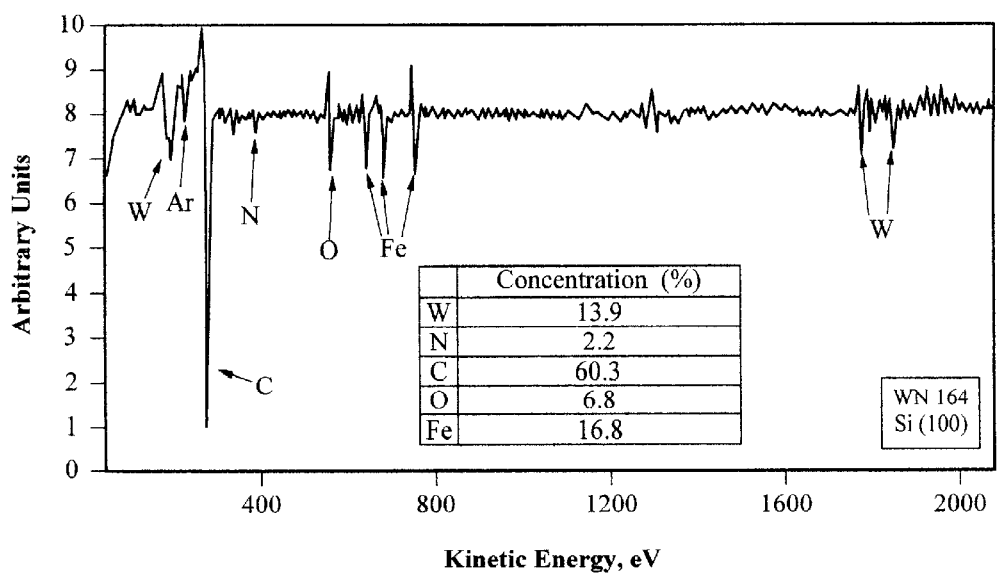

AES plots of the composition of the resulting $WN_x$ layer are shown in FIGS. 10(a) and 10(b). FIG. 10(a) shows the composition at the surface, while FIG. 10(b) shows the $WN_x$ composition at the sub-surface layer reached by sputtering for approximately 1.0 minute. As can be seen from FIGS. 10(a) and 10(b), the $WN_x$ layer had approximately 5% W, 3% N and 65% C, 17% O and Fe 9% at the surface, while the composition of the $WN_x$ layer reached after a 1.0 minute sputter was 14% W, 2% N, 60% C and 7% O. The Fe surface signal is believed to be derived from Fe incorporated in the film by reactor erosion during deposition.

Figure 11:
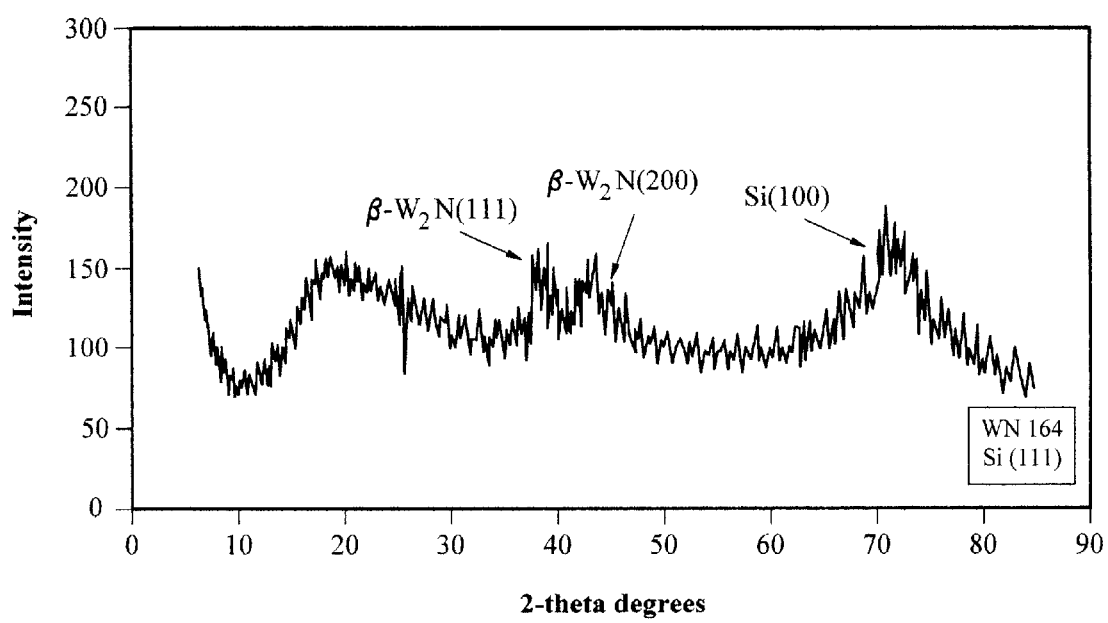
FIG. 11 illustrates an XRD pattern for $WN_x$ layer analyzed using AES in FIGS. 10(a) and 10(b).

FIG. 11 shows that the $WN_x$ layer formed was polycrystalline, having no discernable preferred crystalline orientation. Example 7

$WN_x$ was formed in a MOCVD reactor using a single imido tungsten imido complex of the formula $I_2(CO)_2(C_5H_5N)W{\equiv}NPh$. A solid source delivery system was used to carry the tungsten complex into a MOCVD reactor at a temperature of 675° C. for 150 minutes. Unpatterned silicon substrates were used. The deposition pressure was approximately 760 torr. The $WN_x$ layer thickness and bulk resistivity were not measured.

Figure 12A:
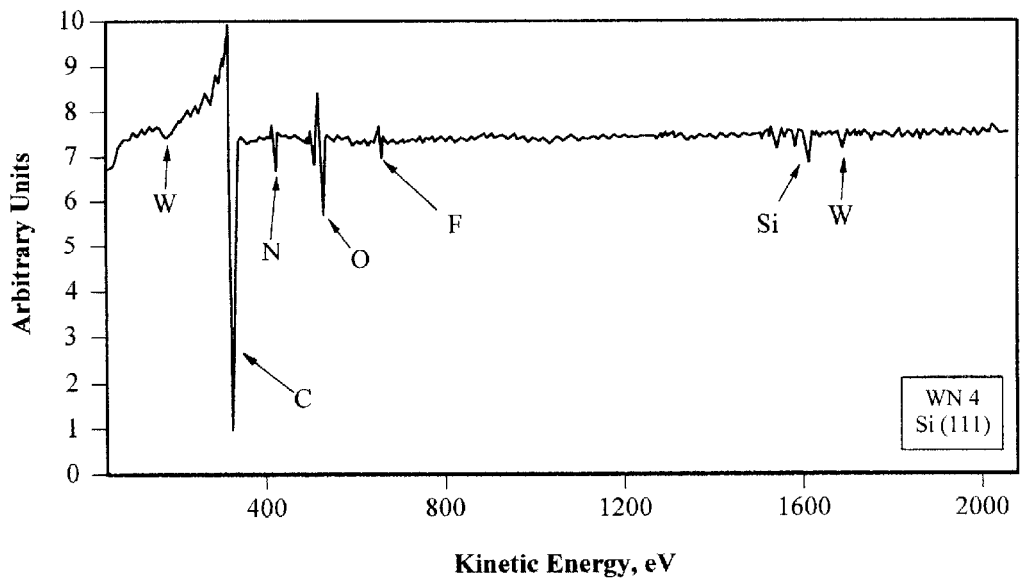
FIG. 12(a) and 12(b) illustrate an AES spectral pattern for a $WN_x$ layer deposited using CVD on a silicon substrate.
Figure 12B:
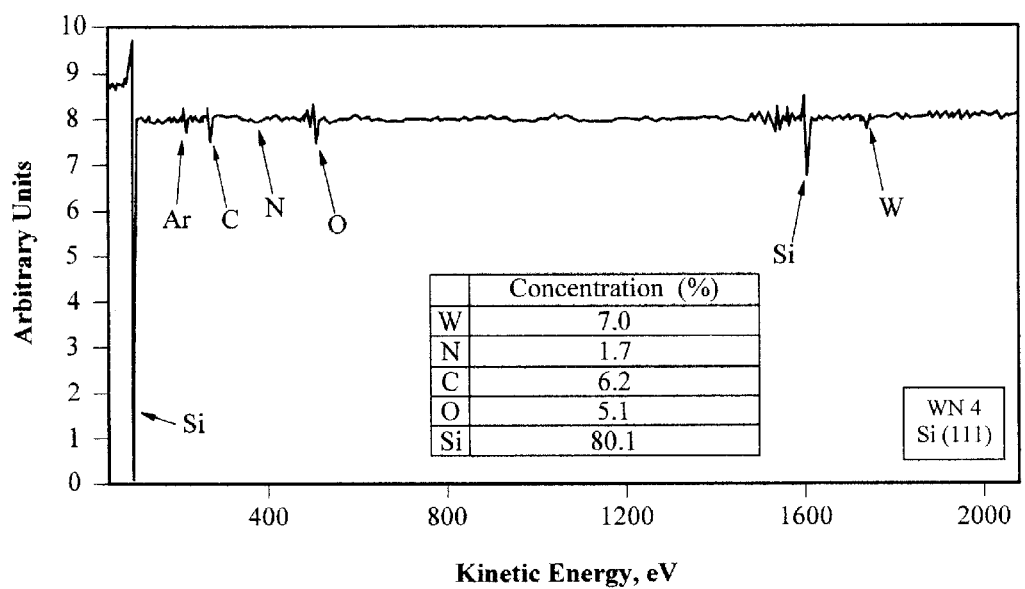

AES plots of the composition of the resulting $WN_x$ layer are shown in FIGS. 12(a) and 12(b). FIG. 12(a) shows the composition at the surface, while FIG. 12(b) shows the $WN_x$ composition at the sub-surface layer reached by sputtering for approximately 0.5 minutes. No concentration data was available from the surface measurements shown in FIG. 12(a). As can be seen from FIG. 12(b), only a modest amount of $WN_x$ was formed, the $WN_x$ layer having approximately 7% W, 2% N, 6% C, 5% O and 80% Si.

Example 8

Single imido tungsten imido precursors below, shown with relevant process conditions included, showed little or no detectable $WN_x$ layer growth.

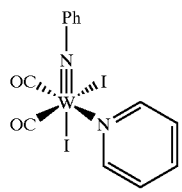

For the precursor above: Solid source delivery system; Reaction temperature: 650–700° C.

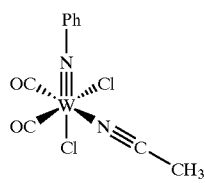

For the precursor above: Solid source delivery system; Reaction temperature: 700° C.

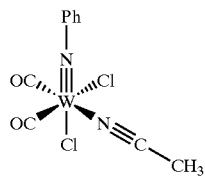

For the precursor above: benzonitrile solvent; Reaction temperature: 1000° C.

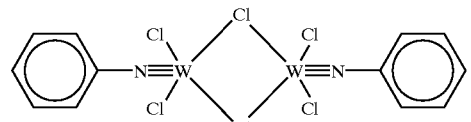

Precursor dissolved in benzonitrile and delivered to reactor by the nebulizer. The above precursor converts to a single imido species in solution in the presence of benzonitrile.

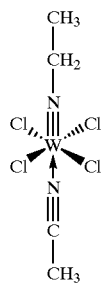

The above precursor dissolved in benzonitrile and delivered to reactor by the nebulizer.

Although the WNx layer growth for the precursors and process conditions shown above failed to deposit appreciable quantities of WNx, modification of processing conditions, such as, but not limited to solvent selection, deposition temperature, carrier gas selection and deposition pressure may result in the formation of significant WNx layer growth for some, or all of the precursors listed in Example 8.

Although single imido tungsten nitride imido source reagents are described for the deposition of tungsten nitride material on a substrate by MOCVD, the reagents described are also suited for use in many other processes, such as, but not limited to plasma assisted metal organic chemical vapor deposition, ion implantation (e.g. in conjunction with an electrospray ion source), molecular beam epitaxy and rapid thermal processing.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as described in the claims.

What is claimed is:

1. A source reagent composition for the formation of tungsten nitride films comprising at least one single imido tungsten imido species selected from the group consisting of:

i) Tungsten imido complexes of the formula:

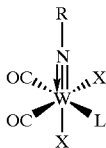

wherein:
R is selected from the group consisting of H, Cl, $C_1$–$C_8$ alkyl, $C_1$–$C_8$ perfluoroaikyl, silicon-containing groups of the type $SiR_1R_2R_3$ and nitrogen-containing groups of the type $NR_4R_5$, wherein each of said $R_1$–$R_5$ are selected from the group consisting of H, Cl, $C_1$–$C_8$ alkyl, aryl and $C_1$–$C_8$ perfluoroalkyl;

X is selected from the group consisting of F, Cl, Br, I and $N_3$;

L is selected from the group consisting of $C_1$–$C_8$ alkylnitrile, arylnitrile, ether, cyclic ether, heterocyclic aromatic amine, heterocyclic aliphatic amine and alkyl amine ($NR_{11}R_{12}R_{13}$), wherein each of $R_{11}$, $R_{12}$, $R_{13}$ are selected from the group consisting of H, $C_1$–$C_8$ alkyl, aryl, $C_1$–$C_8$ perfluoroalkyl and silicon-containing groups of the type $SiR_{21}R_{22}R_{23}$; wherein each of said $R_{21}$, $R_{22}$ and $R_{23}$ are selected from the group consisting of H, $C_1$–$C_8$ alkyl, aryl and $C_1$–$C_8$ perfluoroalkyl;

ii) tungsten imido complexes of the formula:

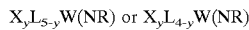

wherein
R is selected from the group consisting of H, Cl, $C_1$–$C_8$ alkyl, aryl, $C_1$–$C_8$ perfluoroalkyl, silicon-containing groups of the type $SiR_1R_2R_3$ and nitrogen-containing groups of the type $NR_4R_5$, wherein each of said $R_1$–$R_5$ is selected from the group consisting of H, Cl, $C_1$–$C_8$ alkyl, aryl and $C_1$–$C_8$ perfluoroalkyl;

X is selected from the group consisting of F, Cl, Br, I, $N_3$ and $NR_{11}R_{12}$, wherein each of $R_{11}$ and $R_{12}$ are selected from the group consisting of H, Cl, $C_1$–$C_8$ alkyl, aryl, $C_1$–$C_8$ perfluoroalkyl, silicon-containing groups of the type $SiR_{13}R_{14}R_{15}$ and nitrogen-containing groups of the type $NR_{16}R_{17}$, wherein each of said $R_{13}$–$R_{17}$ is selected from H, Cl, $C_1$–$C_8$ alkyl, aryl and $C_1$–$C_8$ perfluoroalkyl;

y is an integer between 2 and 4, and

L is selected from the group consisting of $C_1$–$C_8$ alkylnitrile, arylnitrile, ether, cyclic ether, heterocyclic aromatic amine, heterocyclic aliphatic amine, alkylamine ($NR_{21}R_{22}R_{23}$), wherein each of said $R_{21}$, $R_{22}$, $R_{23}$ are selected from the group consisting of H, $C_1$–$C_8$ alkyl, aryl, $C_1$–$C_8$ perfluoroalkyl and silicon-containing groups of the type $SiR_{24}R_{25}R_{26}$; wherein each of each of $R_{24}$, $R_{25}$ and $R_{26}$ are selected from the group consisting of H, $C_1$–$C_8$ alkyl, aryl and $C_1$–$C_8$ perfluoroalkyl;

iii) tungsten imido complexes of the formula:

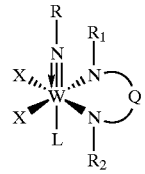

wherein:
each of R, $R_1$, $R_2$ are selected from the group consisting of H, Cl, $C_1$–$C_8$ alkyl, aryl, $C_1$–$C_8$ perfluoroalkyl, silicon-containing groups of the type $SiR_3R_4R_5$ and nitrogen-containing groups of the type $NR_6R_7$, wherein each of said $R_3$–$R_7$ is selected from the group consisting of H, Cl, $C_1$–$C_8$ alkyl, aryl and $C_1$–$C_8$ perfluoroalkyl;

X is selected from the group consisting of F, Cl, Br, I, $N_3$ and $NR_{11}R_{12}$, wherein $R_{11}$, $R_{12}$ are selected from the group consisting of H, Cl, $C_1$–$C_8$ alkyl, aryl, $C_1$–$C_8$ perfluoroalkyl, silicon-containing group of the type $SiR_{13}R_{14}R_{15}$ and nitrogen-containing groups of the type $NR_{16}R_{17}$, wherein each of $R_{13}$–$R_{17}$ is selected from the group consisting of H, Cl, $C_1$–$C_8$ alkyl, aryl, $C_1$–$C_8$ perfluoroalkyl;

Q is selected from the group consisting of $(CH_2)_2$, $(CH_2)_3$, and $CH=CH$;

L is selected from the group consisting of $C_1$–$C_8$ alkylnitrile, arylnitrile, ether, cyclic ether, heterocyclic aromatic amine, heterocyclic aliphatic amine and alkylamine ($NR_{21}R_{22}R_{23}$), wherein each of said $R_{21}$, $R_{22}$, $R_{23}$ are selected from the group consisting of H, $C_1$–$C_8$ alkyl, aryl, $C_1$–$C_8$ perfluoroalkyl and silicon-containing group of the type $SiR_{24}R_{25}R_{26}$ where each of $R_{24}$, $R_{25}$, $R_{26}$ are selected from the group consisting of H, $C_1$–$C_8$ alkyl, aryl and $C_1$–$C_8$ perfluoroalkyl, and L may also be an empty coordination site with no ligand;

iv) tungsten imido complexes of the formula:

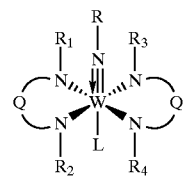

wherein:
each of R, $R_1$–$R_4$ are selected from the group consisting of H, Cl, $C_1$–$C_8$ alkyl, aryl, $C_1$–$C_8$ perfluoroalkyl, silicon-containing groups of the type $SiR_5R_6R_7$ and nitrogen-containing groups of the type $NR_8R_9$, wherein each of said $R_5$–$R_9$ are selected from the group consisting of H, Cl, $C_1$–$C_8$ alkyl, aryl, $C_1$–$C_8$ perfluoroalkyl;

wherein Q is selected from the group consisting of $(CH_2)_2$, $(CH_2)_3$ and CH=CH and wherein L is selected from the group consisting of $C_1$–$C_8$ alkylnitrile, arylnitrile, ether, cyclic ether, heterocyclic aromatic amine, heterocyclic aliphatic amine and alkylamine ($NR_{11}R_{12}R_{13}$), wherein each of $R_{11}$, $R_{12}$, $R_{13}$ are selected from the group consisting of H, $C_1$–$C_8$ alkyl, aryl, $C_1$–$C_8$ perfluoroalkyl and silicon-containing groups of the type $SiR_{14}R_{15}R_{16}$ wherein each of $R_{14}$, $R_{15}$, $R_{16}$ are selected from the group consisting of H, $C_1$–$C_8$ alkyl, aryl and $C_1$–$C_8$ perfluoroalkyl, and L may also be an empty coordination site with no ligand;

v) tungsten imido complexes of the formula:

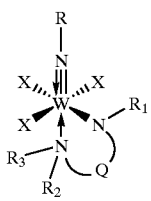

wherein:

each of R, $R_1$–$R_3$ are selected from the group consisting of H, Cl, $C_1$–$C_8$ alkyl, aryl, $C_1$–$C_8$ perfluoroalkyl, silicon-containing groups of the type $SiR_5R_6R_7$ and nitrogen-containing groups of the type $NR_8R_9$, wherein each of said $R_5$–$R_9$ are selected from the group consisting of H, Cl, $C_1$–$C_8$ alkyl, aryl and $C_1$–$C_8$ perfluoroalkyl;

X is selected from the group consisting of F, Cl, Br, I, $N_3$ and $NR_{11}R_{12}$, wherein each of said $R_{11}$ and $R_{12}$ are selected from the group consisting of H, Cl, $C_1$–$C_8$ alkyl, aryl, $C_1$–$C_8$ perfluoroalkyl, silicon-containing groups of the type $SiR_{13}R_{14}R_{15}$ and nitrogen-containing groups of the type $NR_{16}R_{17}$, wherein each of said $R_{13}$–$R_{17}$ is selected from the group consisting of H, Cl, $C_1$–$C_8$ alkyl, aryl, $C_1$–$C_8$ perfluoroalkyl, and Q is selected from the group consisting of $(CH_2)_2$ and $(CH_2)_3$.

2. A source reagent composition for the formation of tungsten nitride films comprising at least one single imido tungsten imido species, wherein said single imido tungsten imido species is at least one selected from the groups of formulas consisting of $X_yL_{5-y}W(NR)$ and $X_yL_{4-y}W(NR)$, wherein:

R is selected from the group consisting of H, Cl, $C_1$–$C_8$ alkyl, aryl, $C_1$–$C_8$ perfluoroalkyl, silicon-containing groups of the type $SiR_1R_2R_3$ and nitrogen-containing groups of the type $NR_4R_5$, wherein each of said $R_1$–$R_5$ is selected from the group consisting of H, Cl, $C_1$–$C_8$ alkyl, aryl and $C_1$–$C_8$ perfluoroalkyl;

X is selected from the group consisting of F, Cl, Br, I, $N_3$ and $NR_{11}R_{12}$, wherein each of $R_{11}$ and $R_{12}$ are selected from the group consisting of H, Cl, $C_1$–$C_8$ alkyl, aryl, $C_1$–$C_8$ perfluoroalkyl, silicon-containing groups of the type $SiR_{13}R_{14}R_{15}$ and nitrogen-containing groups of the type $NR_{16}R_{17}$, wherein each of said $R_{13}$–$R_{17}$ is selected from H, Cl, $C_1$–$C_8$ alkyl, aryl and $C_1$–$C_8$ perfluoroalkyl;

y is an integer between 2 and 4, and

L is selected from the group consisting of $C_1$–$C_8$ alkylnitrile, arylnitrile, ether, cyclic ether, heterocyclic aromatic amine, heterocyclic aliphatic amine, alkylamine ($NR_{21}R_{22}R_{23}$), wherein each of said $R_{21}$, $R_{22}$, $R_{23}$ are selected from the group consisting of H, $C_1$–$C_8$ alkyl, aryl, $C_1$–$C_8$ perfluoroalkyl and silicon-containing groups of the type $SiR_{24}R_{25}R_{26}$; wherein each of each of $R_{24}$, $R_{25}$ and $R_{26}$ are selected from the group consisting of H, $C_1$–$C_8$ alkyl, aryl and $C_1$–$C_8$ perfluoroalkyl.

3. The source reagent composition according to claim 2, wherein said single imido tungsten imido species is selected from tungsten imido complexes having the formula $X_yL_{5-y}W(NR)$.

4. The source reagent composition according to claim 3, wherein y=4.

5. The source reagent composition according to claim 1, wherein L is an alkylnitrile.

6. The source reagent composition according to claim 1, wherein R is selected from the group of $C_1$–$C_8$ alkyls, and silyls.

7. The source reagent composition according to claim 6, wherein R is selected from the group consisting of isopropyl, t-butyl and cyclohexyl.

8. The source reagent composition according to claim 7, wherein L is an alkylnitrile.

9. The source reagent composition according to claim 8, wherein L is acetonitrile.

10. The source reagent composition according to claim 9, wherein X is Cl.

11. A source reagent composition for the formation of tungsten nitride films comprising:

at least one single imido tungsten imido species having the formula $L_yW(NR)X_n$, wherein:

R is a carbon containing group excluding CO;

y is an integer between 0 and 4, $L_y$ is selected from the group consisting of $C_1$–$C_8$ alkylnitrile, arylnitrile, ether, cyclic ether, heterocyclic aromatic amine, heterocyclic aliphatic amine and alkylamine ($NR_{11}R_{12}R_{13}$), wherein each of $R_{11}$, $R_{12}$, $R_{13}$ are selected from the group consisting of H, $C_1$–$C_8$ alkyl, aryl, $C_1$–$C_8$ perfluoroalkyl and $X_n$ is selected from the group consisting of F, Cl, Br, I and $N_3$.

12. The composition of claim 11, where R is an alkyl, aryl or silyl group.

* * * * *

UNITED STATES PATENT AND TRADEMARK OFFICE
CERTIFICATE OF CORRECTION

PATENT NO.    : 6,596,888 B2
DATED         : July 22, 2003
INVENTOR(S)   : McElwee-White et al.

It is certified that error appears in the above-identified patent and that said Letters Patent is hereby corrected as shown below:

<u>Title page,</u>
Item [75], Inventors:
Please correct "Omer J. Bchir" to read -- Omar J. Bchir --.

Signed and Sealed this

Twenty-fifth Day of November, 2003

JAMES E. ROGAN
*Director of the United States Patent and Trademark Office*